(12) United States Patent
Kwon et al.

(10) Patent No.: US 10,410,886 B2
(45) Date of Patent: Sep. 10, 2019

(54) METHODS OF FABRICATING A SEMICONDUCTOR DEVICE

(71) Applicant: Samsung Electronics Co., Ltd., Suwon-si, Gyeonggi-do (KR)

(72) Inventors: TaeYong Kwon, Suwon-si (KR); Sangjin Kim, Suwon-si (KR); Donghoon Hwang, Hwaseong-si (KR); Sebeom Oh, Ansan-si (KR); Yunkyeong Jang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 126 days.

(21) Appl. No.: 15/602,599

(22) Filed: May 23, 2017

(65) Prior Publication Data

US 2017/0345679 A1   Nov. 30, 2017

(30) Foreign Application Priority Data

May 25, 2016   (KR) ........................ 10-2016-0064244

(51) Int. Cl.

| | |
|---|---|
| *H01L 21/56* | (2006.01) |
| *H01L 21/311* | (2006.01) |
| *H01L 21/8234* | (2006.01) |
| *H01L 23/544* | (2006.01) |
| *H01L 21/308* | (2006.01) |

(52) U.S. Cl.
CPC ........ *H01L 21/565* (2013.01); *H01L 21/3086* (2013.01); *H01L 21/31144* (2013.01); *H01L 21/823468* (2013.01); *H01L 23/544* (2013.01); *H01L 2223/5446* (2013.01); *H01L 2223/54426* (2013.01)

(58) Field of Classification Search
CPC ...................... H01L 21/3086; H01L 21/31144
See application file for complete search history.

(56) References Cited

U.S. PATENT DOCUMENTS

| | | |
|---|---|---|
| 8,748,989 B2 | 6/2014 | Lin et al. |
| 9,070,577 B2 | 6/2015 | Lee |
| 9,257,439 B2 | 2/2016 | Liaw |

(Continued)

FOREIGN PATENT DOCUMENTS

| | | |
|---|---|---|
| JP | 2011-233894 A | 11/2011 |
| JP | 2012-59959 A | 3/2012 |

(Continued)

*Primary Examiner* — Ermias T Woldegeorgis
(74) *Attorney, Agent, or Firm* — Myers Bigel, P.A.

(57) ABSTRACT

Methods of fabricating a semiconductor device are provided. The methods may include forming a lower mold layer on a substrate that includes first and second regions, forming first and second intermediate mold patterns on the first and second regions, respectively, forming first spacers on sidewalls of the first and second intermediate mold patterns, etching the lower mold layer to form first and second lower mold patterns on the first and second regions, respectively, and etching the substrate to form active patterns and dummy patterns on the first and second regions, respectively. A first distance between a pair of the first intermediate mold patterns may be greater than a second distance between a pair of the second intermediate mold patterns, and the second lower mold patterns may include at least one first merged pattern, whose width is substantially equal to the second distance.

19 Claims, 37 Drawing Sheets

(56) References Cited

U.S. PATENT DOCUMENTS

| | | | |
|---|---|---|---|
| 2010/0093173 A1* | 4/2010 | Park | H01L 21/3086 |
| | | | 438/689 |
| 2011/0260282 A1 | 10/2011 | Kawasaki | |
| 2013/0037871 A1 | 2/2013 | Sudo | |
| 2013/0140638 A1 | 6/2013 | Dixit | |
| 2014/0001562 A1 | 1/2014 | Liaw | |
| 2015/0340503 A1 | 11/2015 | Minari et al. | |

FOREIGN PATENT DOCUMENTS

| | | |
|---|---|---|
| JP | 2013-38213 A | 2/2013 |
| KR | 10-2011-0076221 A | 7/2011 |

* cited by examiner

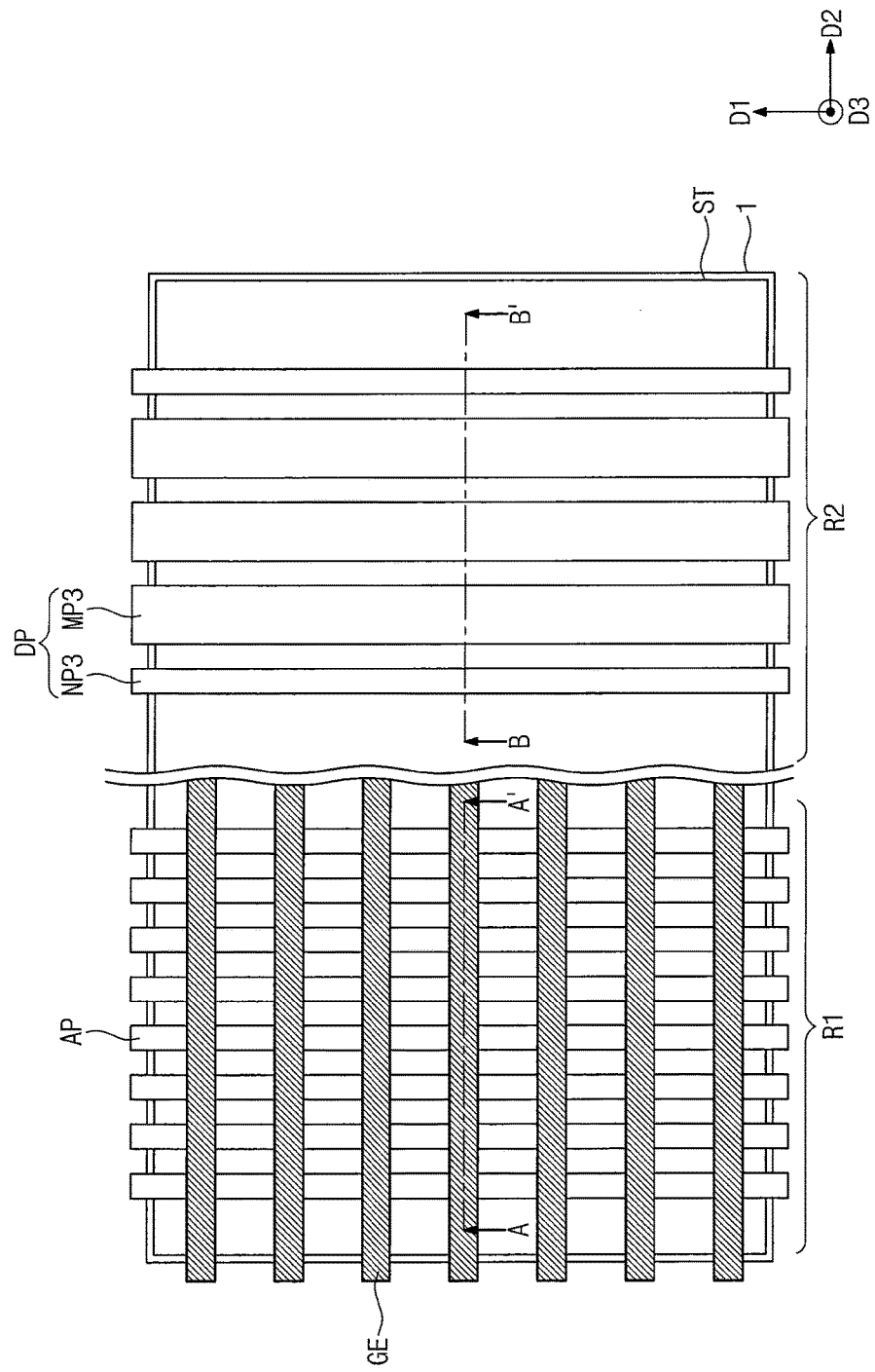

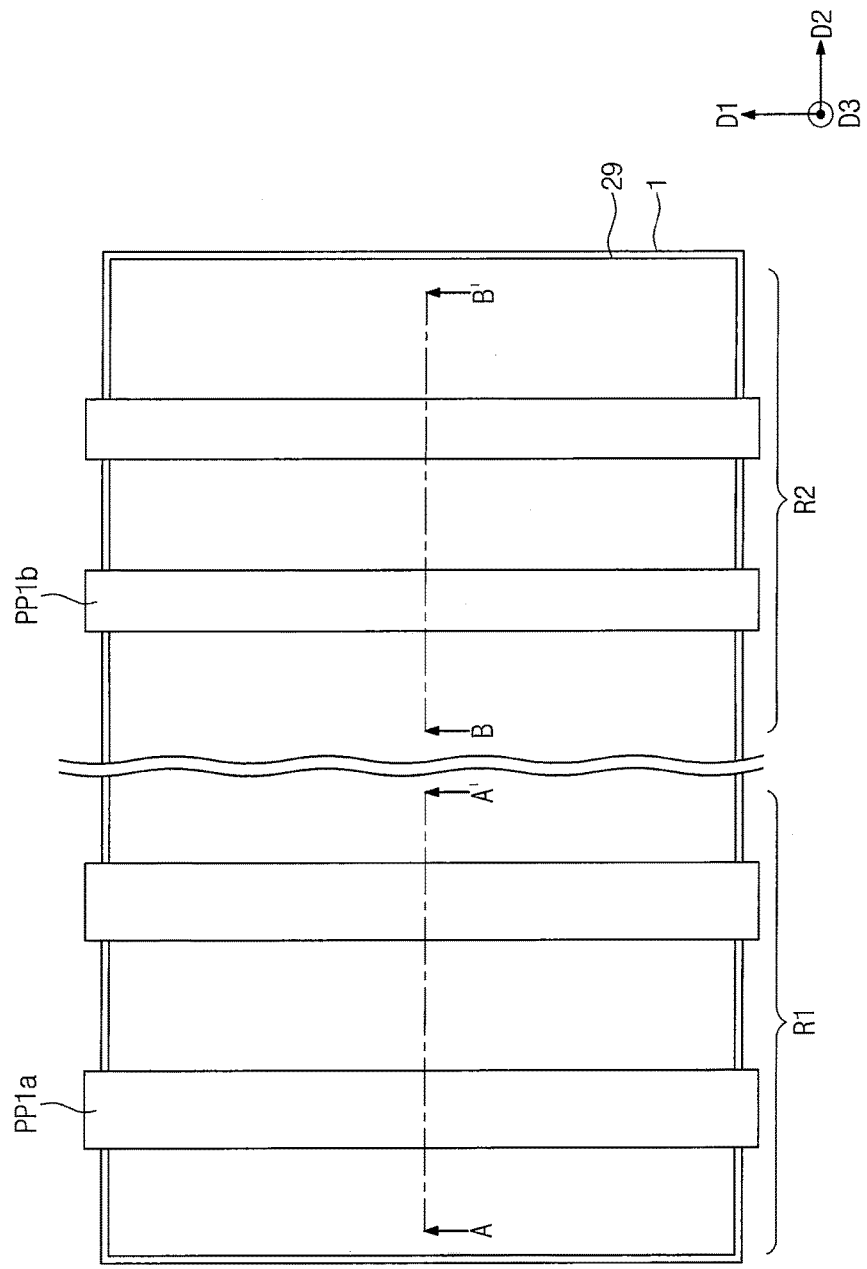

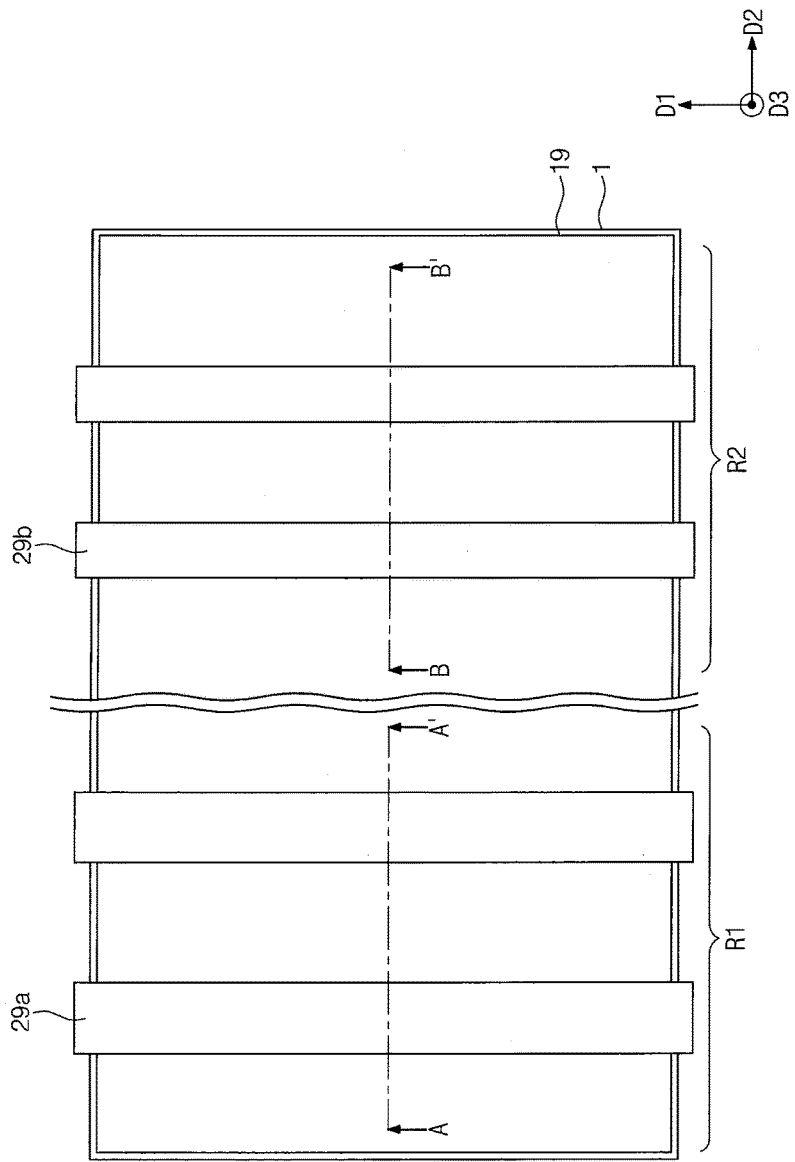

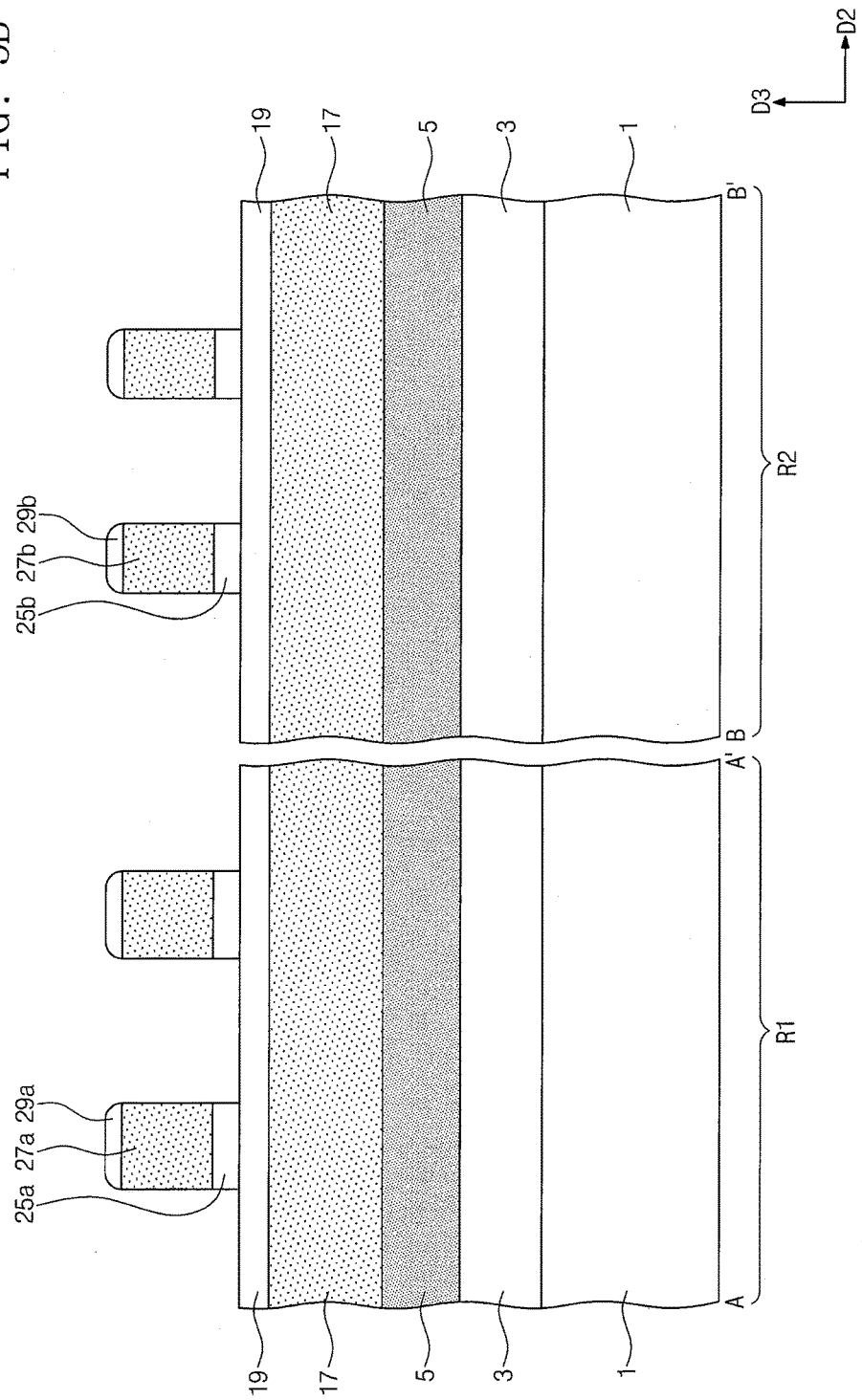

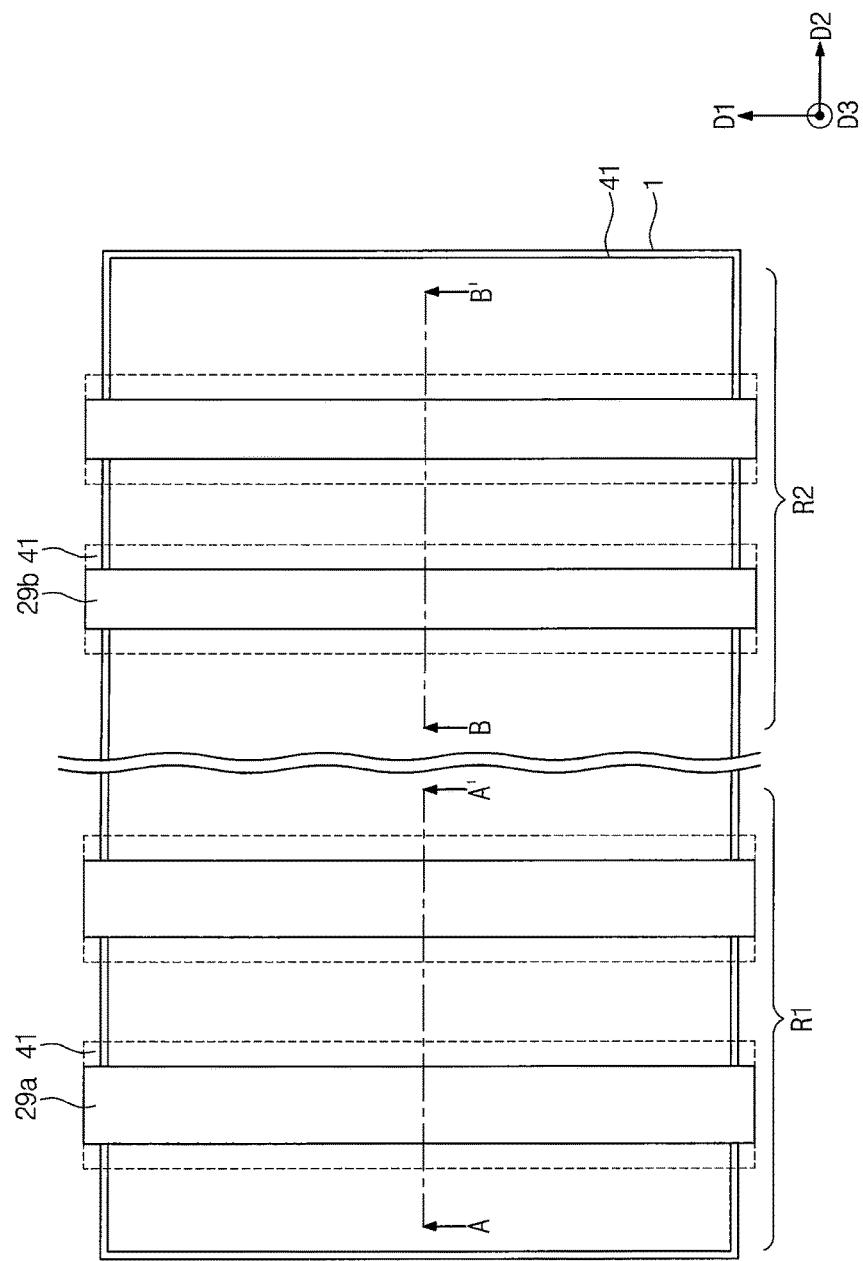

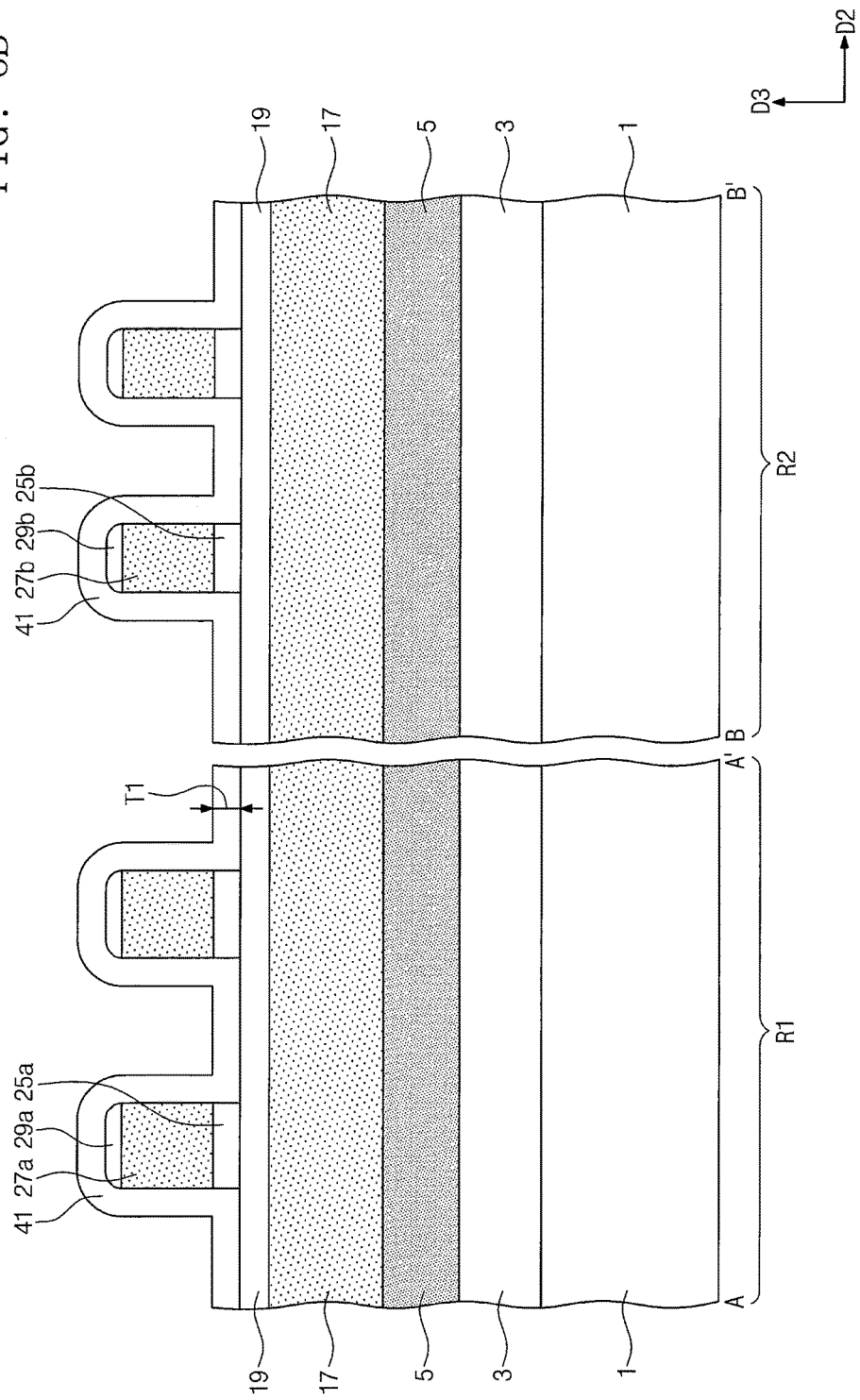

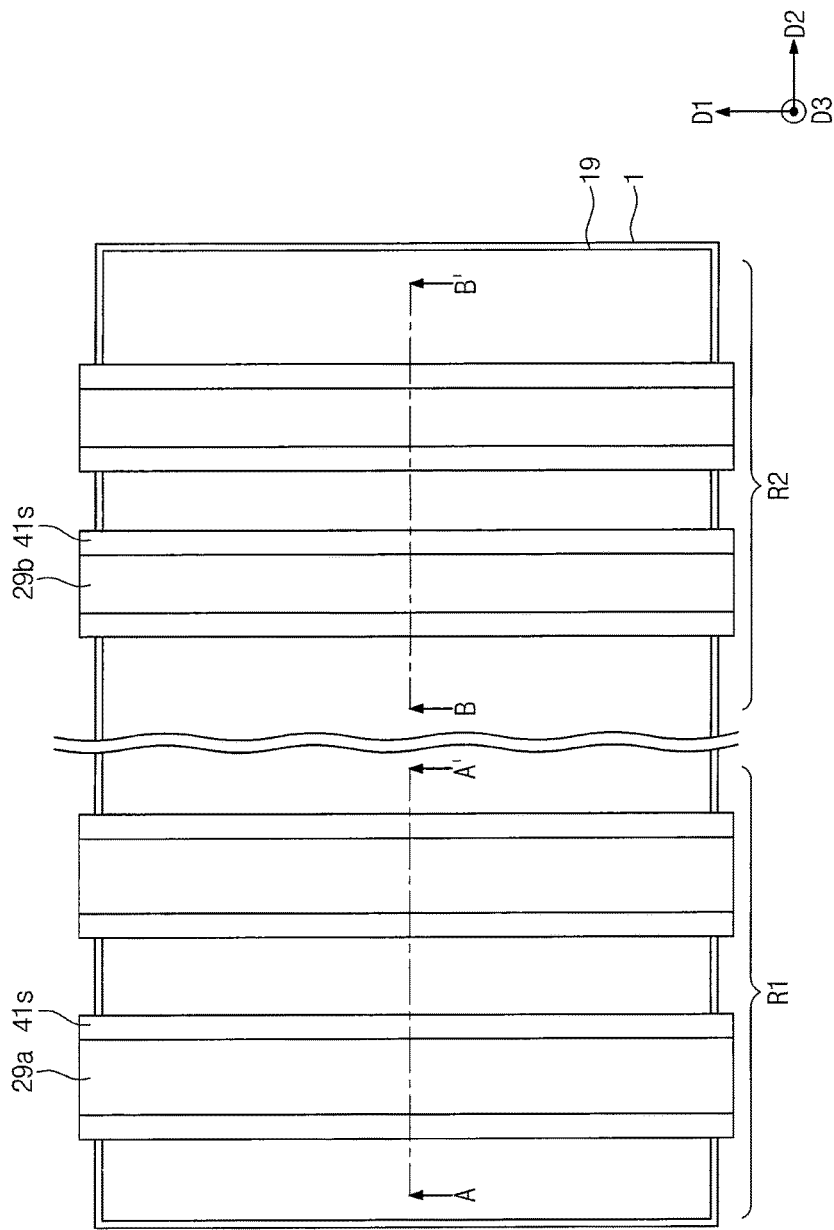

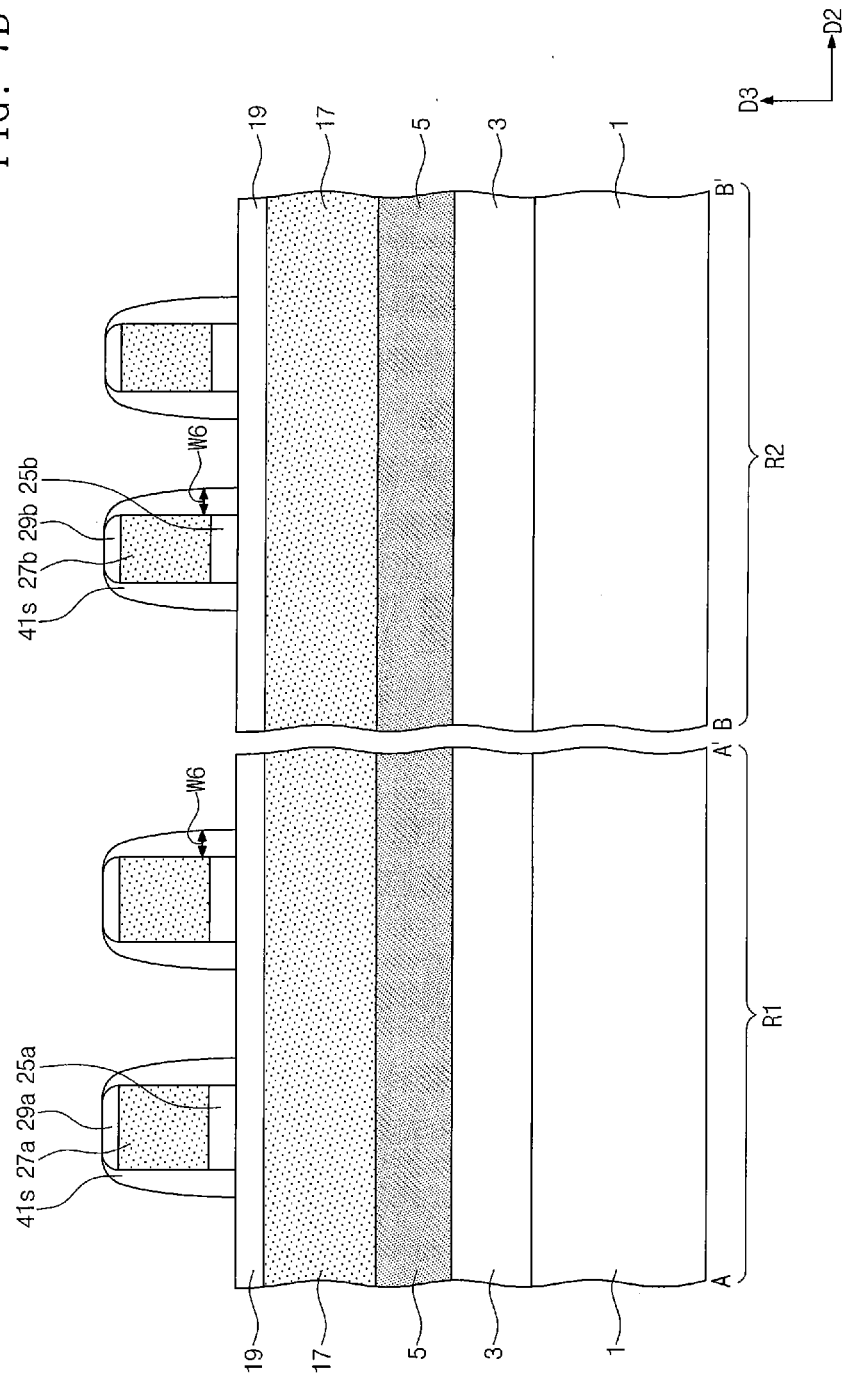

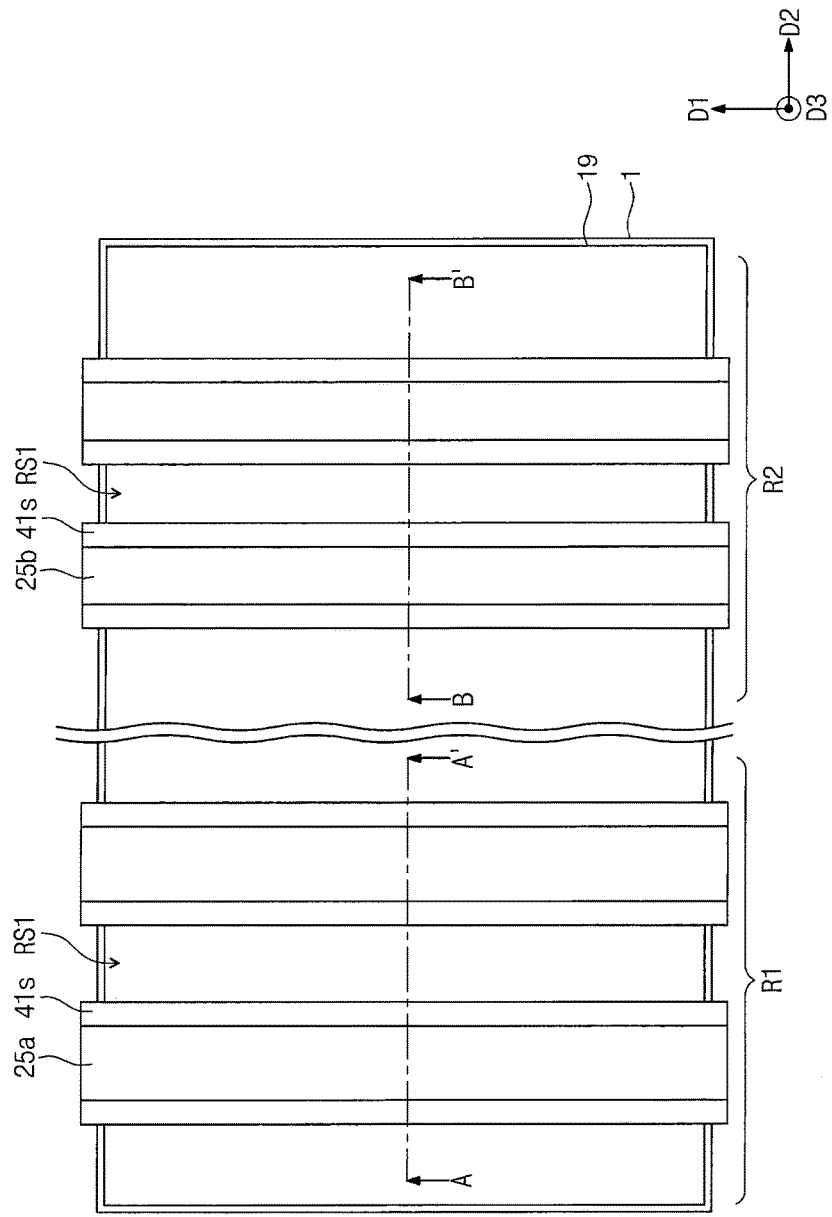

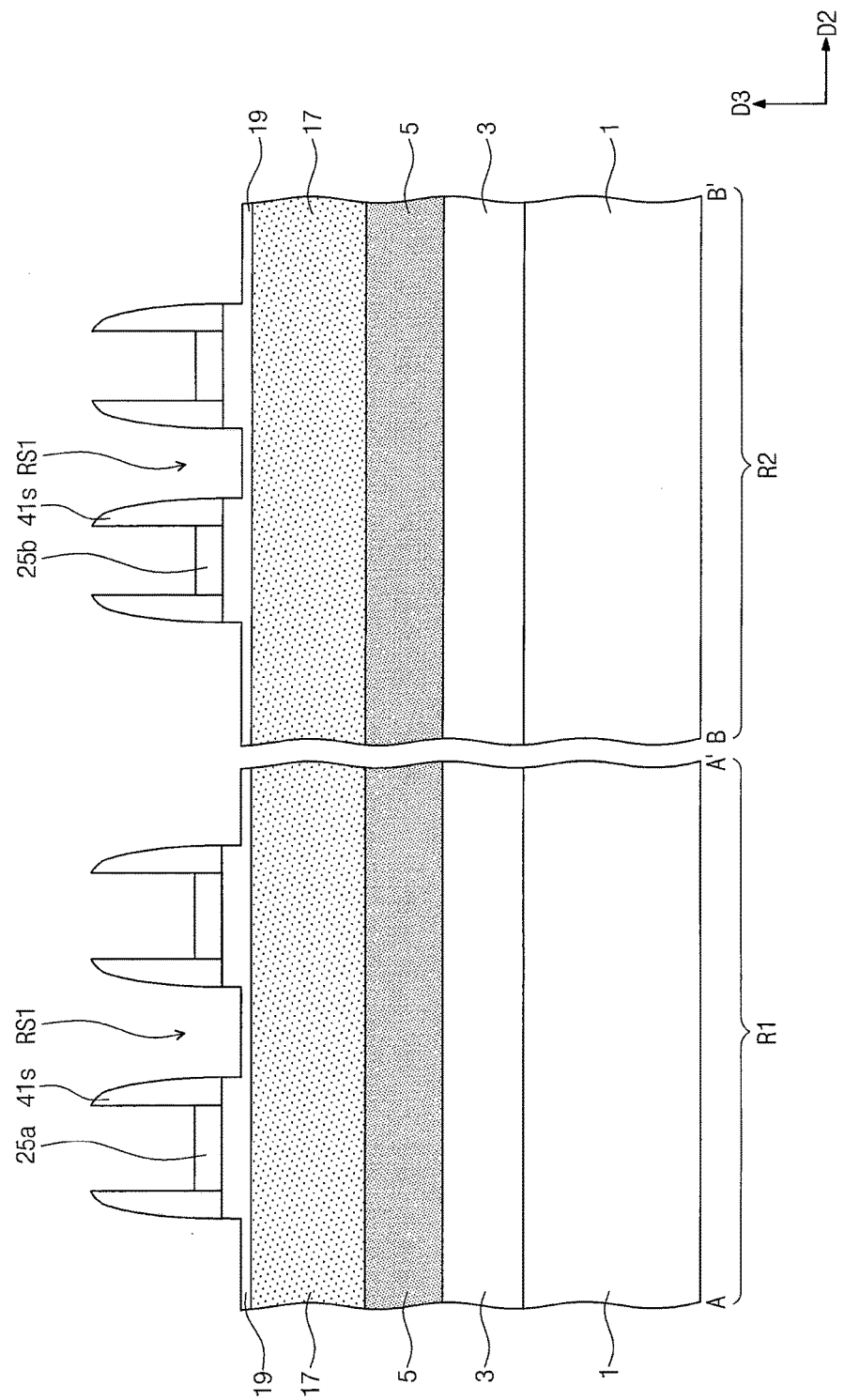

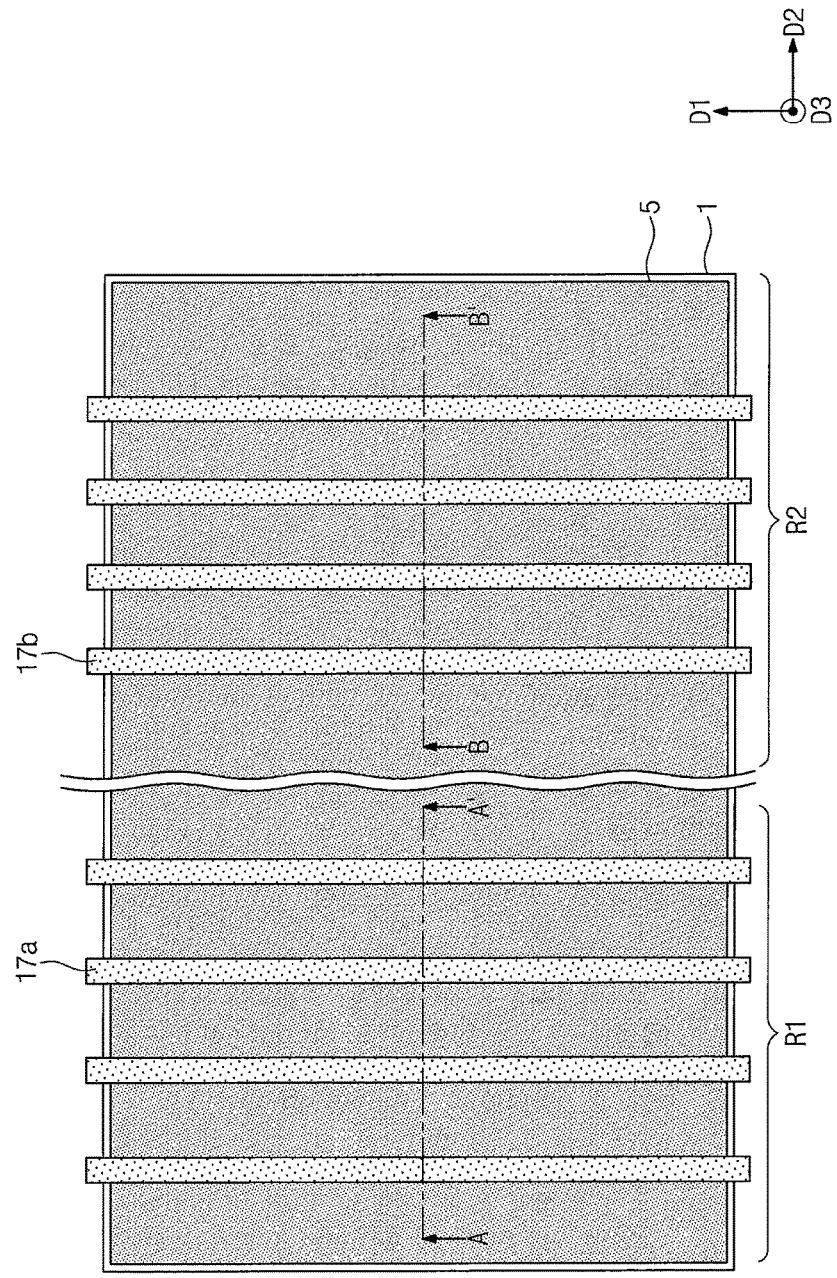

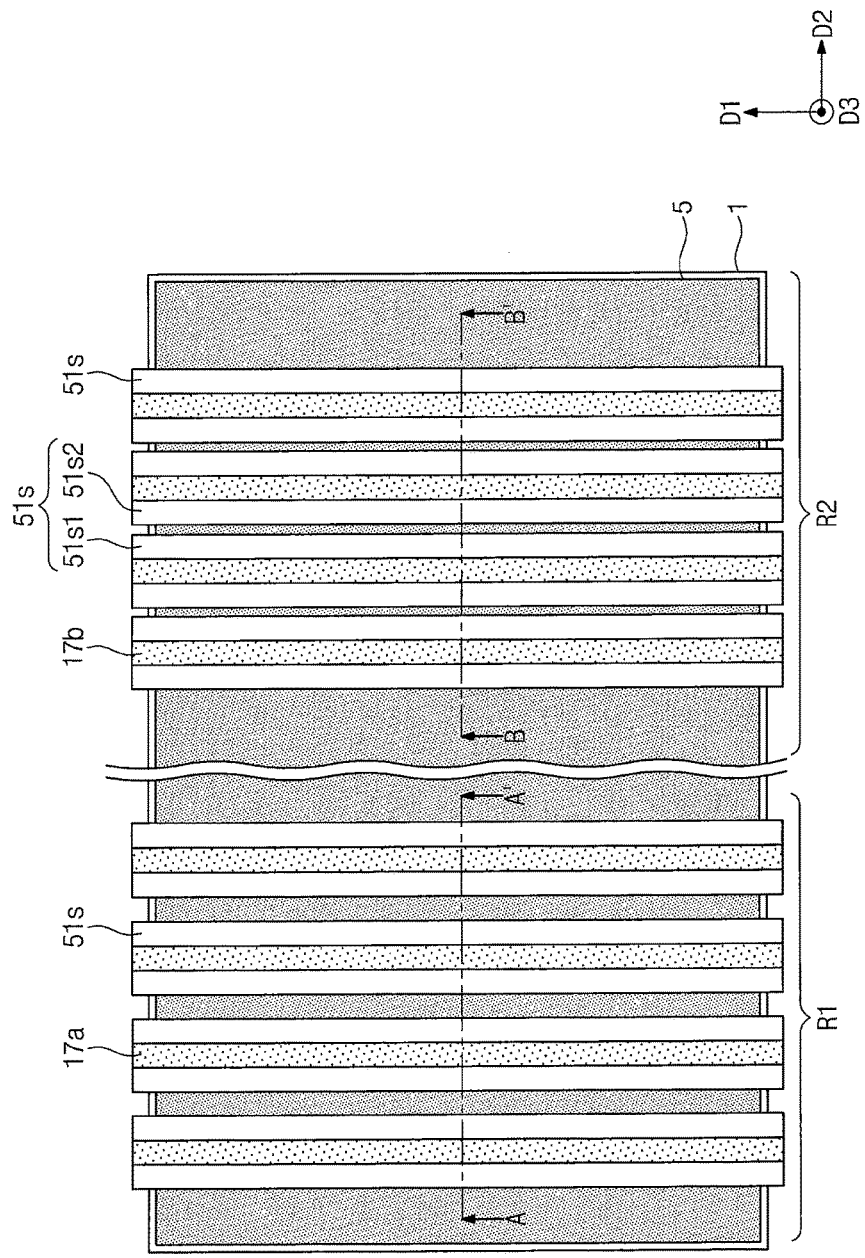

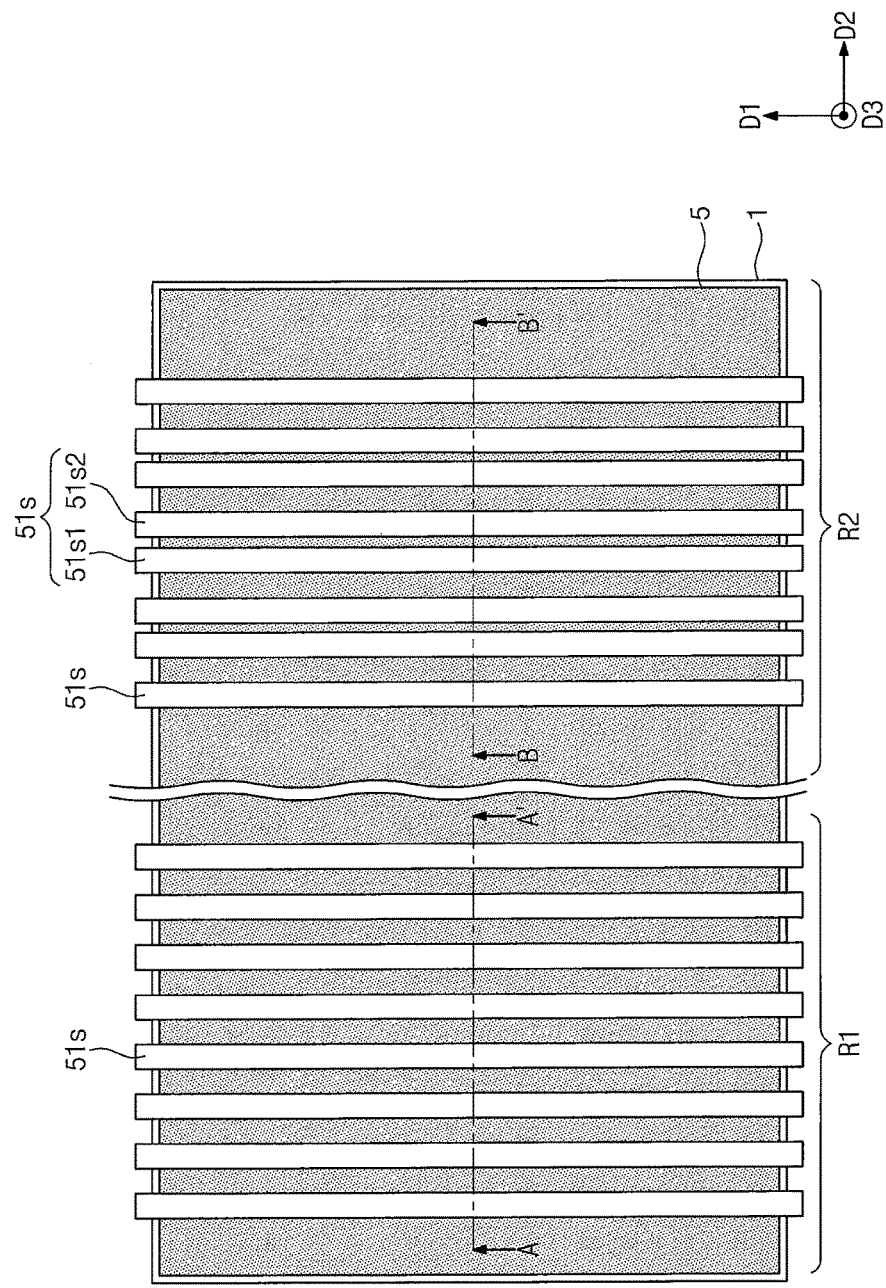

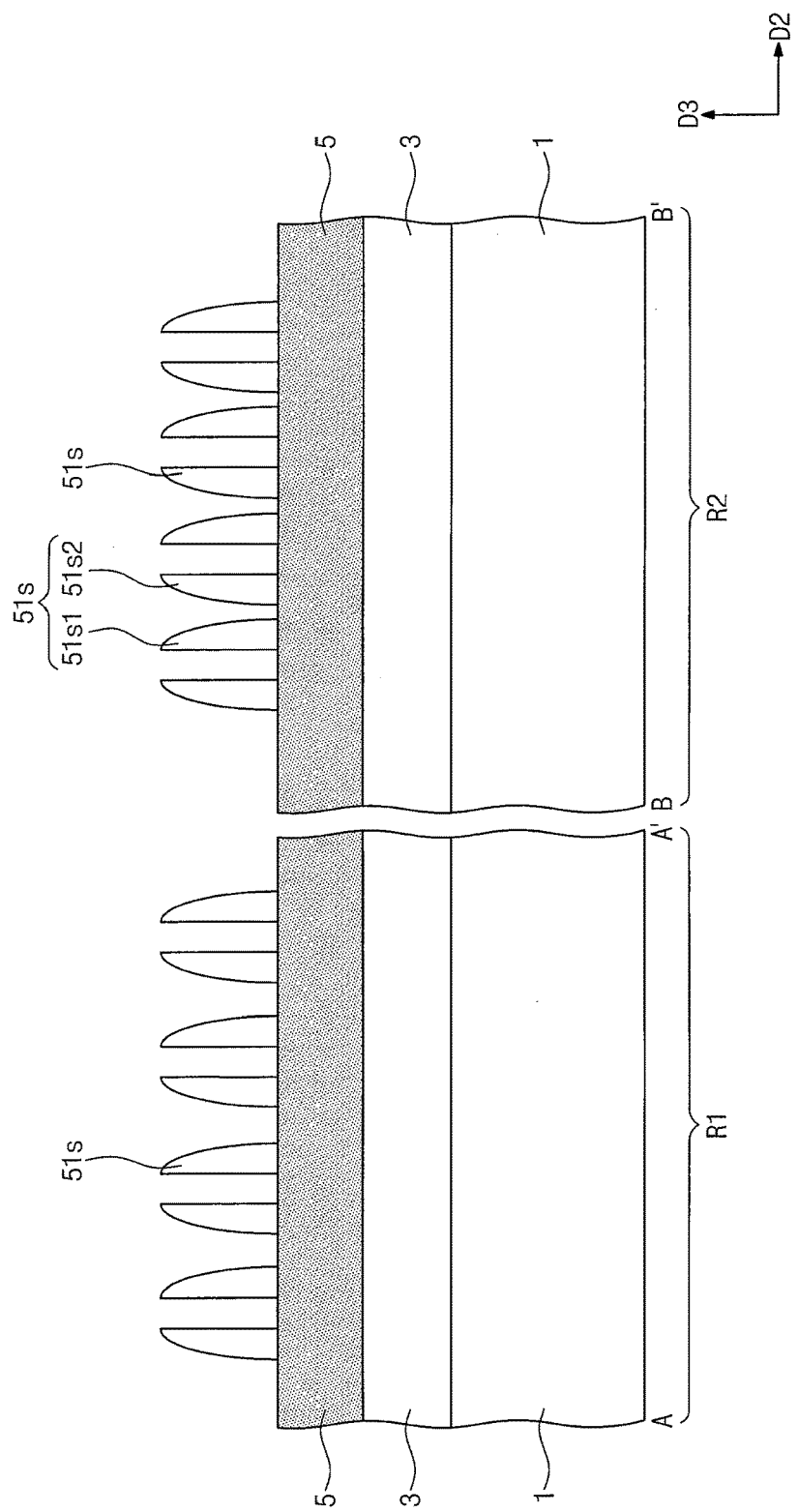

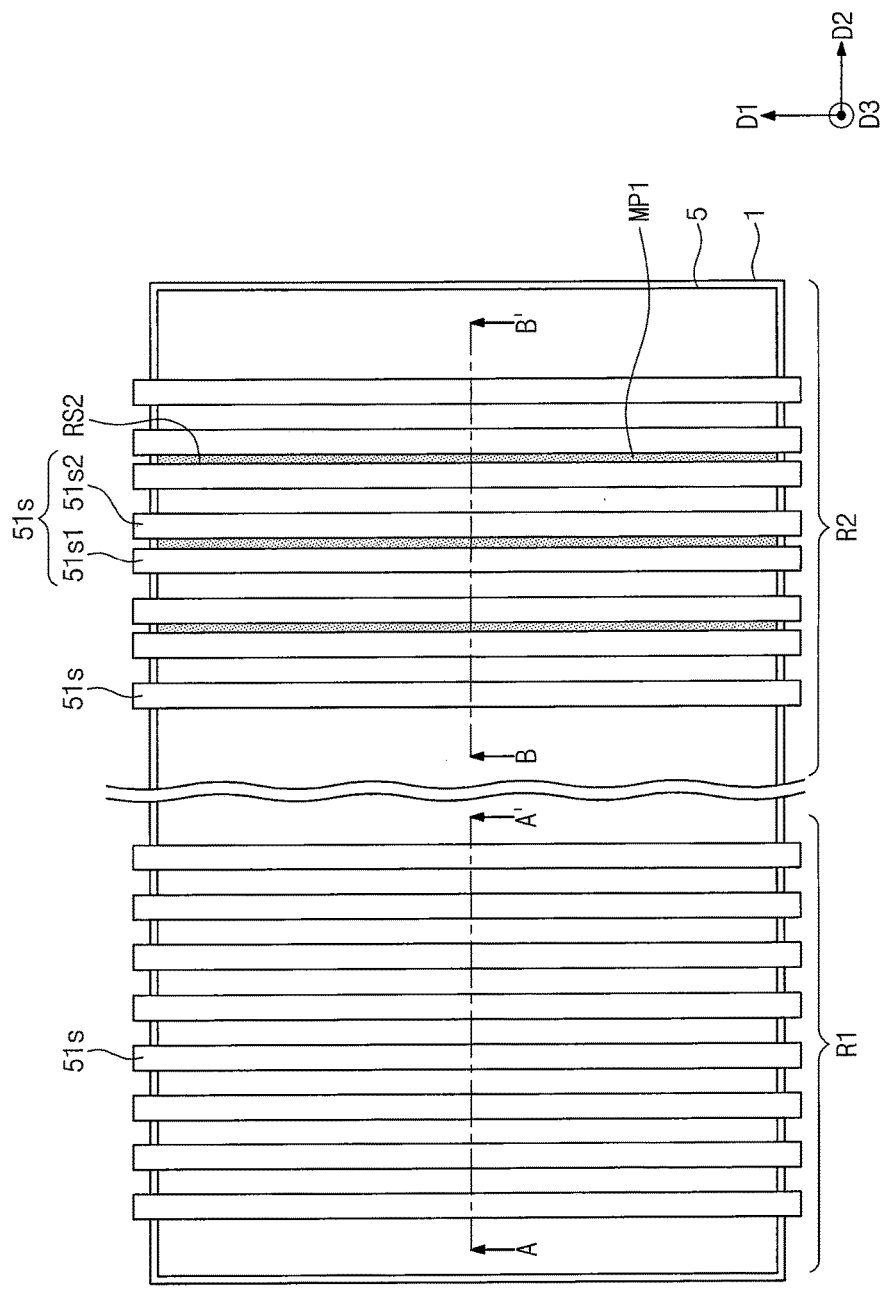

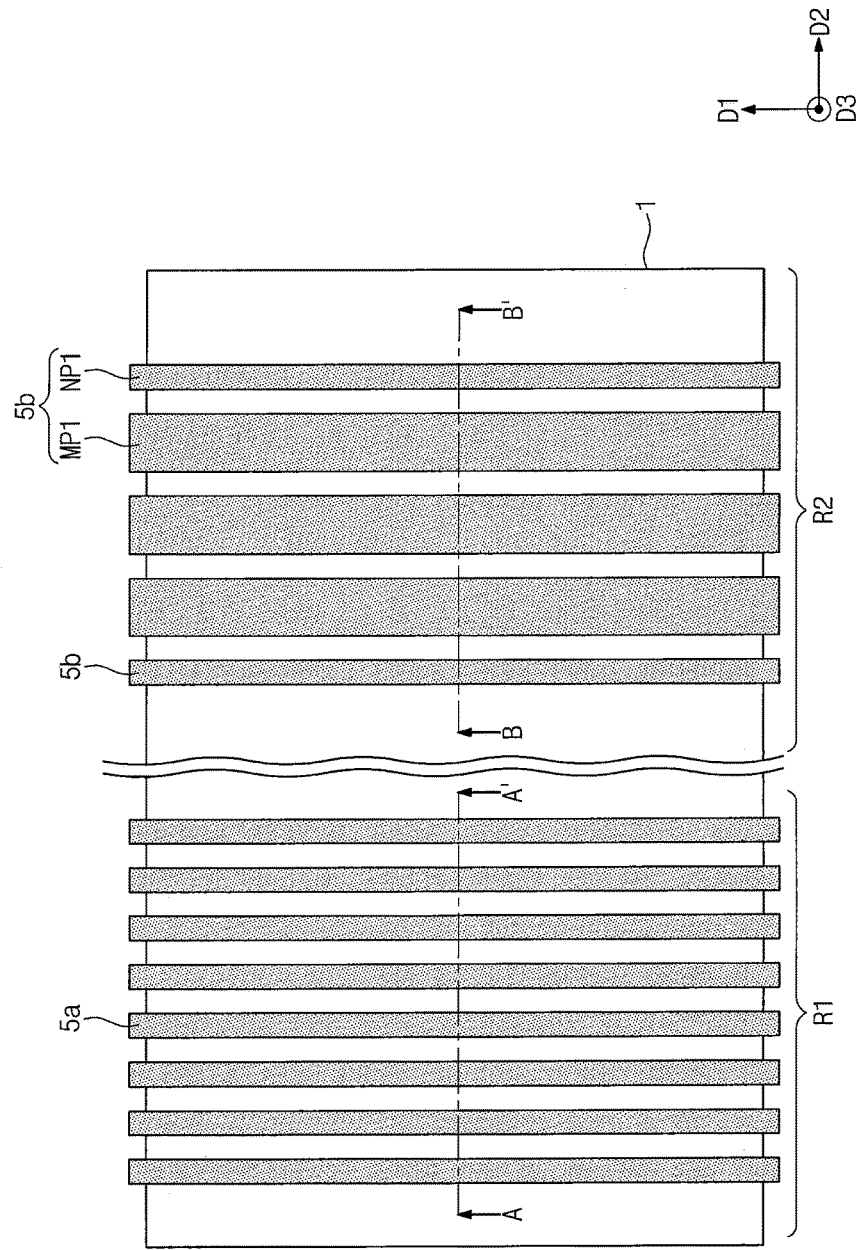

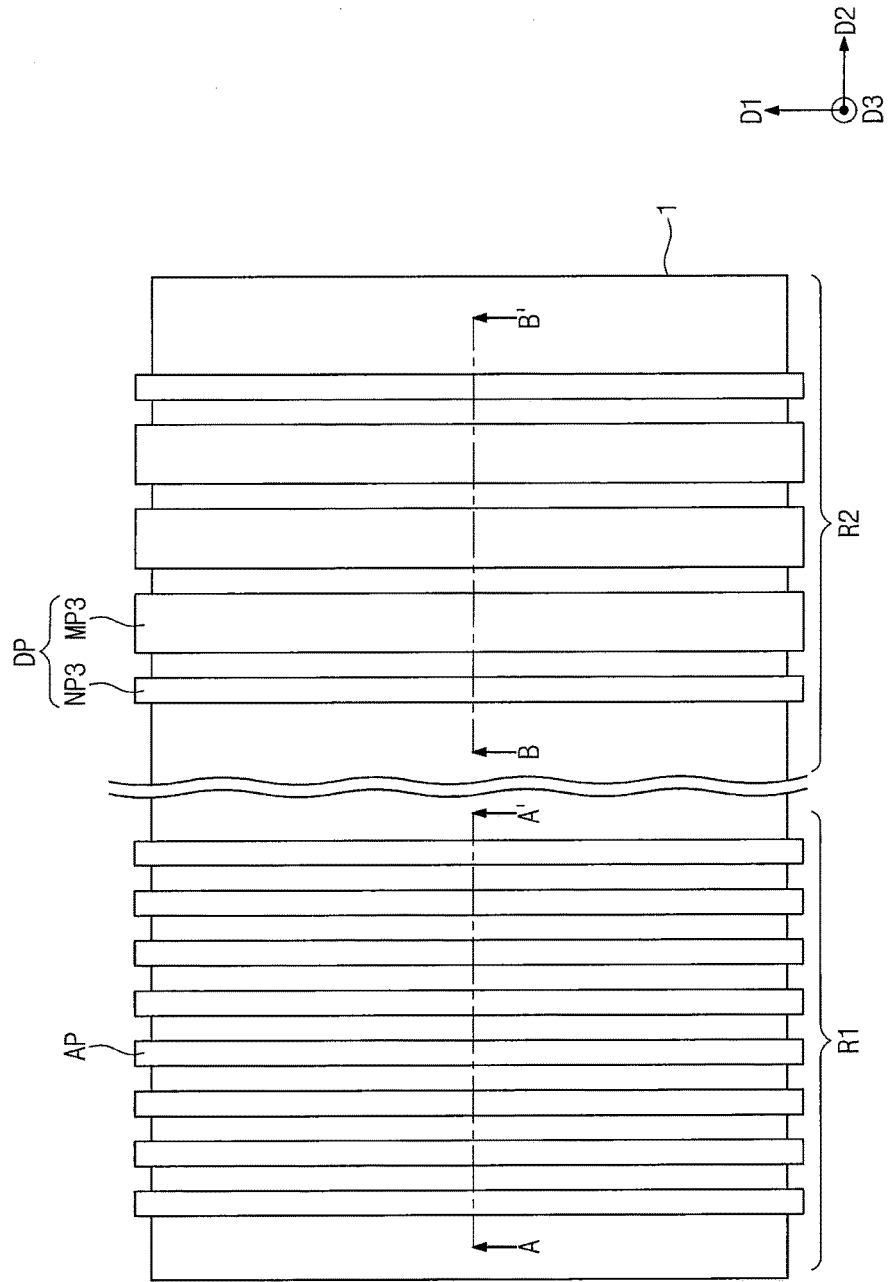

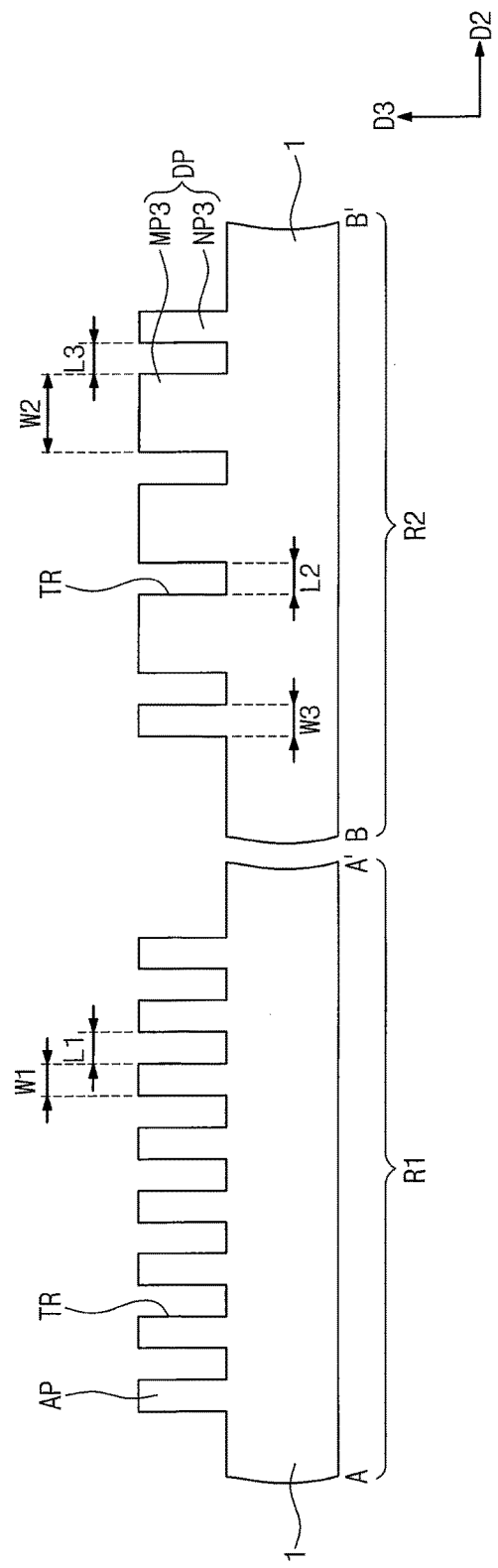

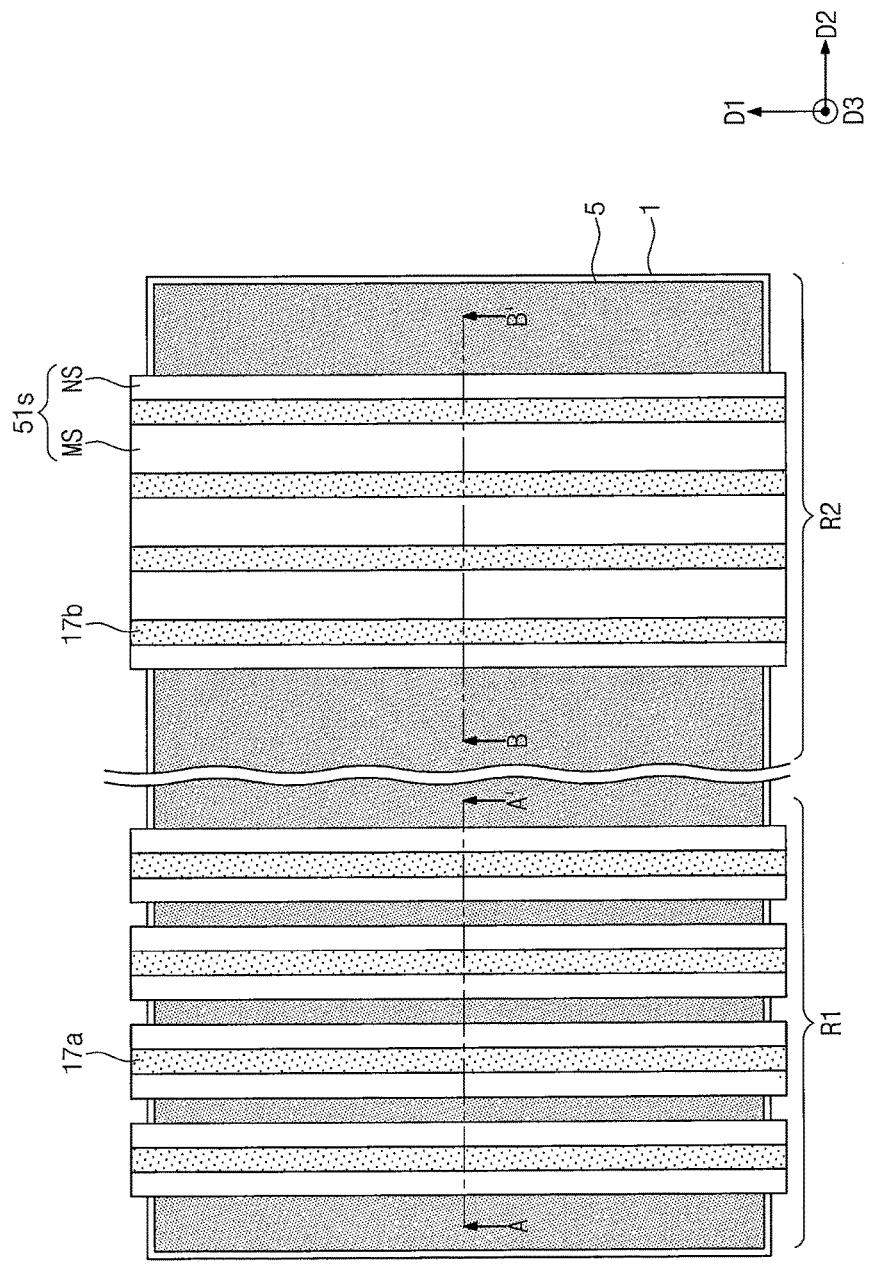

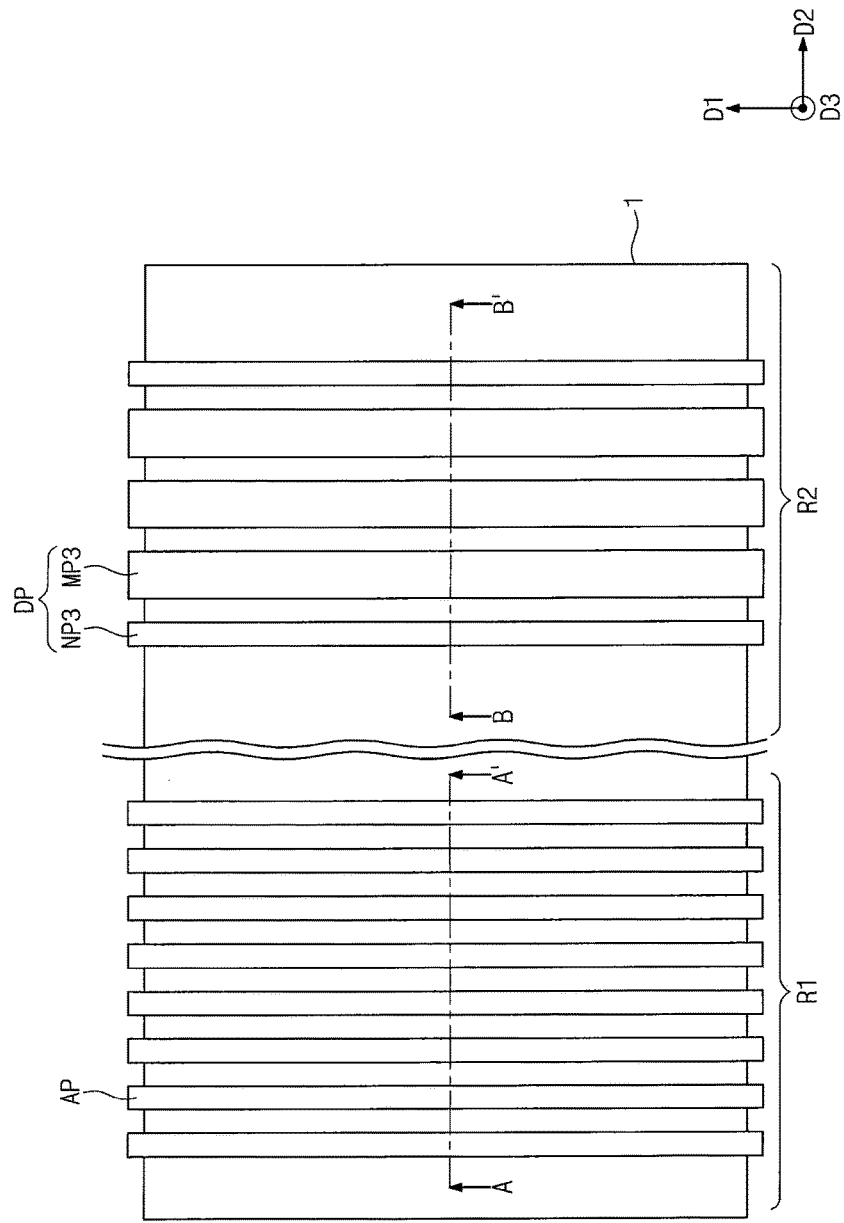

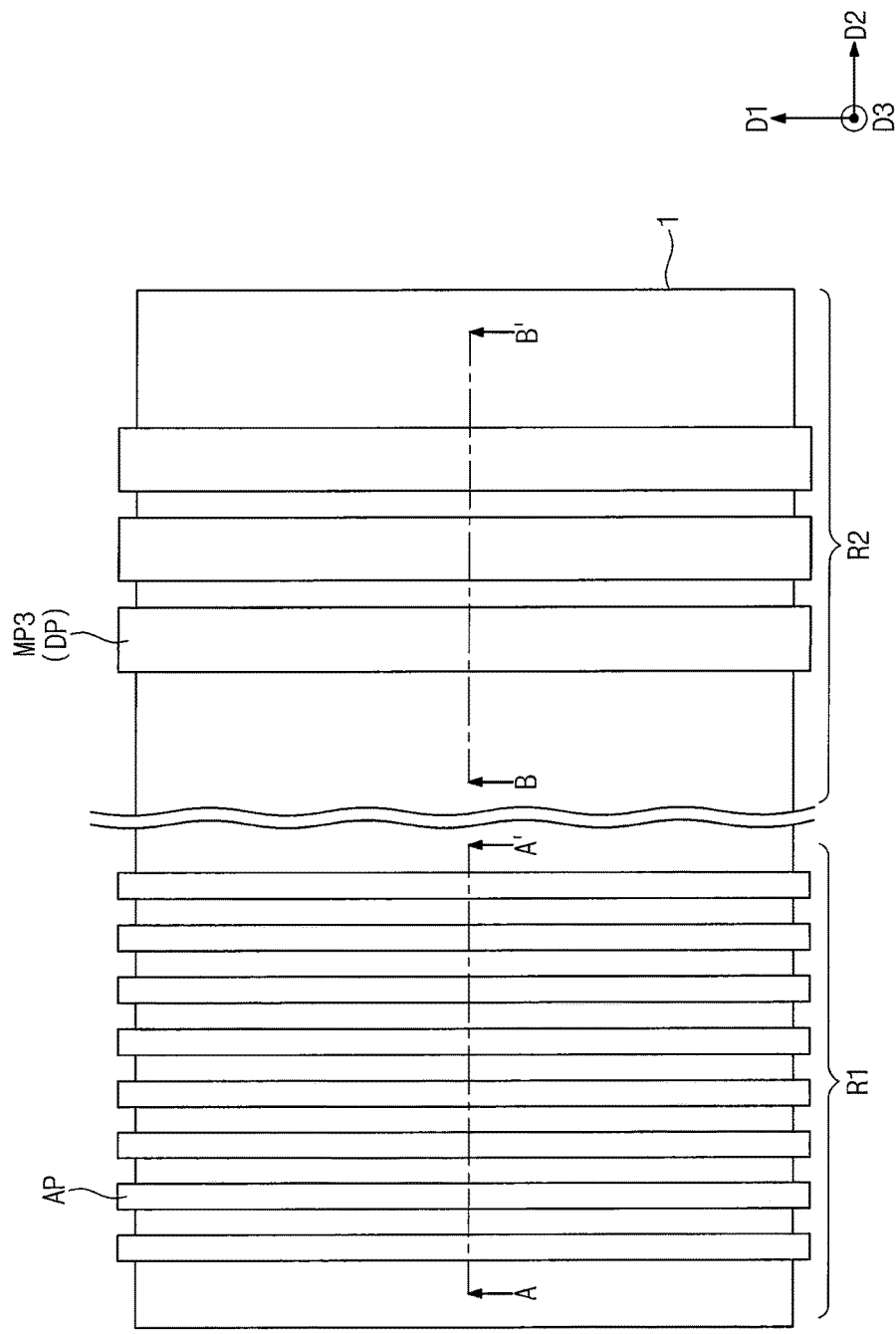

METHODS OF FABRICATING A SEMICONDUCTOR DEVICE

CROSS-REFERENCE TO RELATED APPLICATION

This U.S. non-provisional patent application claims priority under 35 U.S.C. § 119 to Korean Patent Application No. 10-2016-0064244, filed on May 25, 2016, in the Korean Intellectual Property Office, the disclosure of which is hereby incorporated by reference in its entirety.

BACKGROUND OF THE INVENTION

The present disclosure generally relates to the field of electronics, and more particularly, to semiconductor devices.

Due to its small size, multifunction, and/or low manufacturing cost, a semiconductor device is in high-demand in the electronics industry. Semiconductor devices may be classified into a memory device for storing data, a logic device for processing data, and a hybrid device including both of memory and logic elements. To meet the increased demand for electronic devices with fast speed and/or low power consumption, semiconductor devices with high reliability, high performance, and/or multiple functions have been developed and complexity and/or integration density of semiconductor devices have increased.

A double patterning technology may be used to form fine patterns having a dimension smaller than a minimum feature size. However, as an integration density of a semiconductor device increases, a new patterning method, which can be used to form patterns having a size smaller than that of patterns formed by the double patterning process, may be beneficial.

SUMMARY

Some embodiments of the inventive concept may provide a method of fabricating a semiconductor device, in which patterns having different widths are provided, on a substrate.

According to some embodiments of the inventive concept, a method of fabricating a semiconductor device may include forming a lower mold layer on a substrate that includes a first region and a second region, forming a pair of first intermediate mold patterns on the lower mold layer on the first region and a pair of second intermediate mold patterns on the lower mold layer on the second region, forming pairs of first spacers on sidewalls of the first and second intermediate mold patterns, etching the lower mold layer using the pairs of first spacers as an etch mask to form first lower mold patterns and second lower mold patterns on the first and second regions, respectively, and etching an upper portion of the substrate using the first and second lower mold patterns as an etch mask to form active patterns and dummy patterns on the first and second regions, respectively. A first distance between the pair of first intermediate mold patterns may be greater than a second distance between the pair of second intermediate mold patterns, and the second lower mold patterns may include at least one first merged pattern having a first width that may be substantially equal to the second distance.

According to some embodiments of the inventive concept, a method of fabricating a semiconductor device may include sequentially forming mold layers on a substrate that includes first and second regions, patterning the uppermost layer of the mold layers to form n first preliminary mold patterns and m second preliminary mold patterns on the first and second regions, respectively, forming 4n first mold patterns on the first region using the first preliminary mold patterns and (2m+1) second mold patterns on the second region using the second preliminary mold patterns, and etching an upper portion of the substrate using the first and second mold patterns as an etch mask to form active patterns on the first region and dummy patterns on the second region. A width of the first mold pattern may be greater than that of the second mold pattern. n may be an integer that is equal to or greater than 1 and represent a number of the first mold patterns. m may be an integer that is equal to or greater than 1 and represent a number of the second mold patterns. The second region may be an overlay key region, and the dummy patterns may include at least one key pattern.

According to some embodiments of the inventive concept, a method of forming a semiconductor device may include forming a mask layer on a substrate that includes a first region and a second region and forming a plurality of mold patterns on the mask layer. Each of the plurality of mold patterns may have a first width, and the plurality of mold patterns may include first ones of the plurality of mold patterns that are on the first region and are spaced apart from one another by a first distance and second ones of the plurality of mold patterns that are on the second region and are spaced apart from one another by a second distance that is less than the first distance. The method may also include conformally forming a spacer layer on the plurality of mold patterns and etching the spacer layer until upper surfaces of the plurality of mold patterns and an upper surface of the mask layer are exposed. The spacer layer may have a first thickness. First portions of the spacer layer may remain on sides of the first ones of the plurality of mold patterns, respectively, and second portions of the spacer layer may remain on sides of the second ones of the plurality of mold patterns, respectively. The method may further include removing the plurality of mold patterns and then forming a plurality of first mask patterns by etching the mask layer using the first portions of the spacer layer as an etch mask and forming a plurality of second mask patterns by etching the mask layer using the second portions of the spacer layer as an etch mask. The plurality of first mask patterns may be on the first region and may have a second width, the plurality of second mask patterns may be on the second region and may have a third width, and the second width may be less than the third width.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 3A is a plan view illustrating a semiconductor device according to example embodiments of the inventive concept.

FIGS. 4A to 15A are plan views illustrating a method of fabricating a semiconductor device according to some embodiments of the inventive concept.

FIGS. 4B to 15B are cross-sectional views taken along the lines A-A' and B-B' of FIGS. 4A to 15A, respectively.

FIGS. 16A to 18A are plan views illustrating a method of fabricating a semiconductor device according to some embodiments of the inventive concept.

FIGS. 16B to 18B are cross-sectional views taken along the lines A-A' and B-B' of FIGS. 16A to 18A, respectively.

FIG. 19A is a plan view illustrating a method of fabricating a semiconductor device according to some embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Figure 1:
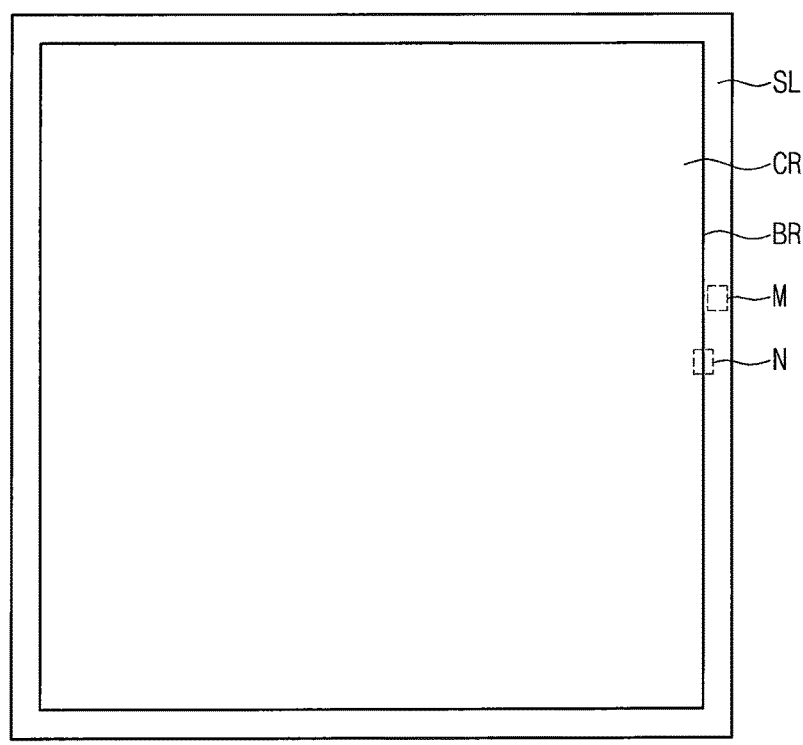
FIG. 1 is a plan view of a semiconductor device according to some embodiments of the inventive concept.
Figure 2A:
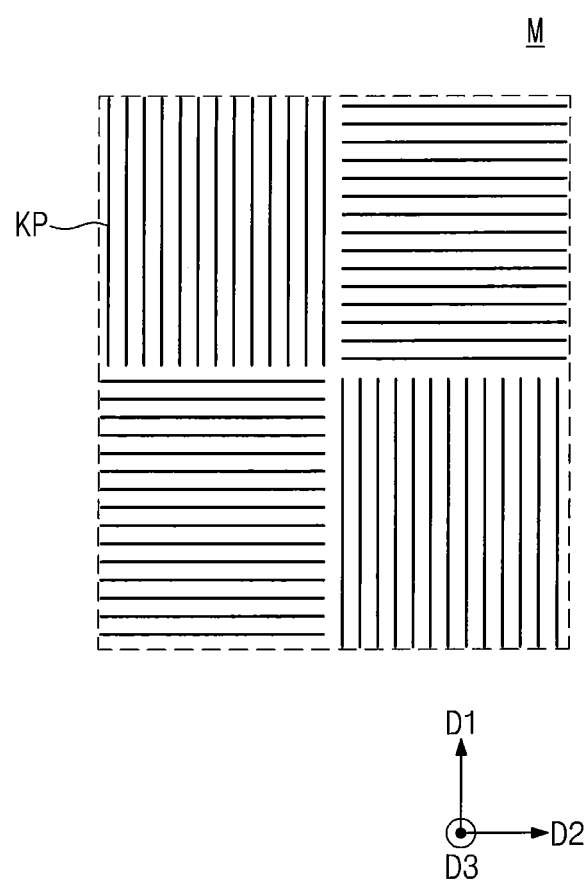
FIG. 2A is an enlarged view illustrating the region M of FIG. 1.

FIG. 1 is a plan view of a semiconductor device according to some embodiments of the inventive concept. FIG. 2A is an enlarged view illustrating the region M of FIG. 1, and FIG. 2B is an enlarged view illustrating the region N of FIG. 1.

Figure 2B:
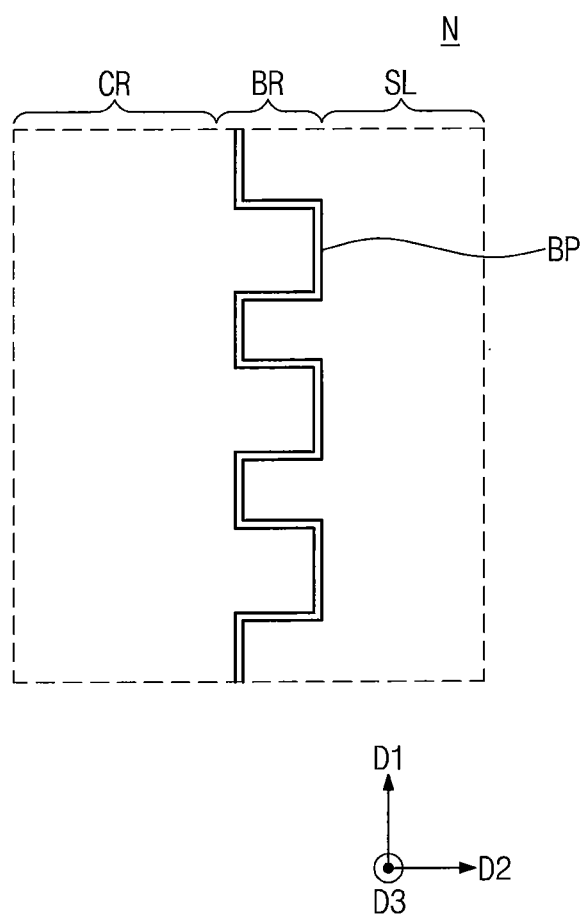
FIG. 2B is an enlarged view illustrating the region N of FIG. 1.

Referring to FIGS. 1, 2A, and 2B, a semiconductor device according to some embodiments of the inventive concept may include a semiconductor chip CH. The semiconductor chip CH may include a chip region CR and a scribe lane region SL. The chip region CR may be positioned at a center region of the semiconductor chip CH, and the scribe lane region SL may be positioned at a peripheral portion of the semiconductor chip CH. In some embodiments, the scribe lane region SL may be provided to enclose the chip region CR as illustrated in FIG. 1. The chip region CR may include circuit patterns for operating the semiconductor chip CH. A boundary region BR may be interposed between the chip region CR and the scribe lane region SL. The chip region CR may include a memory cell region and/or a logic cell region to be described below.

Referring to FIG. 2A, the scribe lane region SL may include an overlay key region. The overlay key region may include a plurality of key patterns KP. The overlay key region may be provided within the scribe lane region SL. In some embodiments, at least a portion of the overlay key region may remain after a cutting process on the semiconductor chip CH. In addition, although not shown, the overlay key region may be provided within the chip region CR. In some embodiments, the key patterns KP may be formed by patterning an upper portion of a substrate of the semiconductor chip CH. In other words, the key patterns KP may be parts of the substrate of the semiconductor chip CH. As an example, some of the key patterns KP may be line-shaped patterns extending in a first direction D1, and some of the key patterns KP may be line-shaped patterns extending in a second direction D2.

Referring to FIG. 2B, a boundary pattern BP may be provided to cross the boundary region BR. In some embodiments, the boundary pattern BP may be formed by patterning the upper portion of the substrate of the semiconductor chip CH. In other words, the boundary pattern BP may be parts of the substrate of the semiconductor chip CH. In some embodiments, the boundary pattern BP may include a plurality of patterns. The boundary pattern BP may have a zigzag shape and may extend in a direction (e.g., in the first direction D1). The boundary pattern BP may serve as a barrier or breakwater for reducing or possibly preventing a foreign substance (e.g., water, steam, or oxygen) from being infiltrated into the chip region CR from the outside during the fabrication process of the semiconductor chip CH.

Figure 3B:
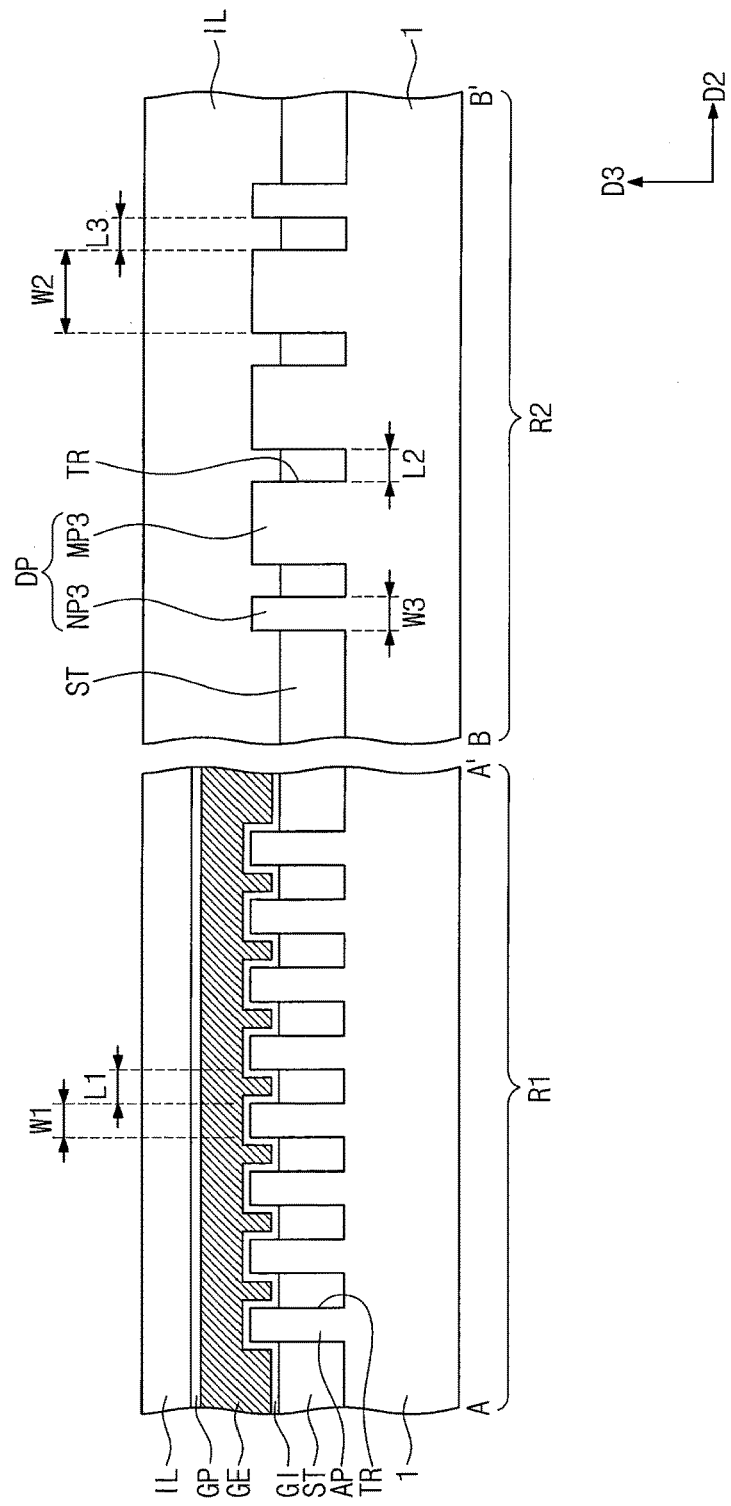
FIG. 3B is a cross-sectional view taken along the lines A-A' and B-B' of FIG. 3A.

FIG. 3A is a plan view illustrating a semiconductor device according to example embodiments of the inventive concept. FIG. 3B is a cross-sectional view taken along the lines A-A' and B-B' of FIG. 3A.

Referring to FIGS. 3A and 3B, a substrate 1 including a first region R1 and a second region R2 may be provided. The substrate 1 may be a single-crystalline silicon wafer or a silicon-on-insulator (SOI) substrate. In some embodiments, the first region R1 may be a memory cell region, on which a plurality of memory cell transistors for storing data may be provided. For example, memory cell transistors including a plurality of static random access memory (SRAM) cells may be provided on the memory cell region of the substrate 1. In some embodiments, the first region R1 may be a logic cell region, on which logic transistors including a logic circuit may be formed. For example, logic transistors including a processor core or an I/O terminal may be provided on the logic cell region of the substrate 1. But the inventive concept may not be limited thereto.

In some embodiments, the second region R2 may be a part of the overlay key region previously described with reference to FIG. 2A. In some embodiments, the second region R2 may be a part of the boundary region BR previously described with reference to FIG. 2B.

Device isolation patterns ST defining active patterns AP and dummy patterns DP may be provided on the substrate 1. In other words, the device isolation patterns ST may be provided to fill trenches TR between the active patterns AP and the dummy patterns DP. Each of the active patterns AP and the dummy patterns DP may be a line-shaped pattern that extends in the first direction D1 that is parallel to a top surface of the substrate 1. The active patterns AP and the dummy patterns DP may be parts of the substrate 1. The device isolation patterns ST may be formed of or include, for example, a silicon oxide layer. Furthermore, the device isolation patterns ST may be connected to each other, thereby substantially constituting a single insulating layer.

Gate electrodes GE may be provided on the first region R1 to cross the active patterns AP and to extend in the second direction D2 crossing the first direction D1. The gate electrodes GE may be arranged in the first direction D1. The active patterns AP and the gate electrodes GE may constitute transistors of the first region R1.

A gate insulating pattern GI may be provided below each of the gate electrodes GE, and a capping pattern GP may be provided on each of the gate electrodes GE. Although not shown, gate spacers may be provided at both sides of each of the gate electrodes GE. In some embodiments, the gate electrode GE may include at least one of doped semiconductors, metals, or conductive metal nitrides. The gate insulating pattern GI may be formed of or include at least one of a silicon oxide layer, a silicon oxynitride layer, or a high-k dielectric layer, whose dielectric constant is higher than that of silicon oxide. Each of the capping pattern GP and the gate spacer may independently include, for example, at least one of a silicon oxide layer, a silicon nitride layer, or a silicon oxynitride layer.

An interlayered insulating layer IL may be provided on the substrate 1 to cover the active patterns AP, the gate electrodes GE and the dummy patterns DP. The interlayered insulating layer IL may be formed of or include, for example, a silicon oxide layer. Although not shown, source/drain regions may be provided on or in the active patterns AP at both sides of the gate electrode GE. In addition, source/drain contacts (not shown) may be provided to penetrate the interlayered insulating layer IL and may be connected to the source/drain regions, respectively. Gate contacts may be provided to penetrate the interlayered insulating layer IL and may be connected to the gate electrodes GE, respectively.

Hereinafter, the active patterns AP and the dummy patterns DP will be described in more detail.

The active patterns AP may be provided on the first region R1. The active patterns AP may serve as source/drain and channel regions of transistors constituting a memory cell or a logic cell. By contrast, the dummy patterns DP may be provided on at least one of the second region R2, but they may not serve as a channel region of a transistor.

The dummy patterns DP may include normal patterns NP3 (i.e., unmerged patterns) and merged patterns MP3. In the case where the second region R2 is a part of the overlay key region, the merged patterns MP3 may be the key patterns. In the case where the second region R2 is a part of the boundary region BR, the merged patterns MP3 may be the boundary patterns.

Each of the active patterns AP may have a first width W1. Each of the merged patterns MP3 may have a second width W2. Each of the normal patterns NP3 may have a third width W3. The second width W2 may be greater than the first width W1, and the third width W3 may be substantially equal to the first width W1. In some embodiments, the second width W2 may be about 1.3-2.5 times the first width W1, but the inventive concept may not be limited thereto.

The merged patterns MP3 may have a width W2 that is greater than those of the active patterns AP and the normal patterns NP3. Accordingly, in the case where the merged patterns MP3 are used as the key patterns, it may be possible to prevent the key pattern from leaning or falling down during the fabrication process. This is because the greater a width of a pattern, a lower an aspect ratio (i.e., a ratio of height to width) of the pattern and the more structural stability the pattern has. Also, this may make it possible to improve a key pattern misreading issue in process equipment. In the case where the merged patterns MP3 are used as the boundary pattern, they may serve as a barrier with a relatively large width, and thus, it may be possible to effectively reduce or possibly prevent infiltration of a foreign material (e.g., water, steam, or oxygen).

A distance between adjacent ones of the active patterns AP may be a first distance L1, a distance between adjacent ones of the merged patterns MP3 may be a second distance L2, and a distance between adjacent ones of the merged and normal patterns MP3 and NP3 may be a third distance L3. In some embodiments, the first distance L1, the second distance L2, and the third distance L3 may be substantially the same. The first distance L1 may be substantially equal to or longer than the first width W1 and may be shorter than the second width W2.

FIGS. 4A to 15A are plan views illustrating a method of fabricating a semiconductor device according to some embodiments of the inventive concept. FIGS. 4B to 15B are cross-sectional views taken along the lines A-A' and B-B' of FIGS. 4A to 15A, respectively.

Figure 4B:
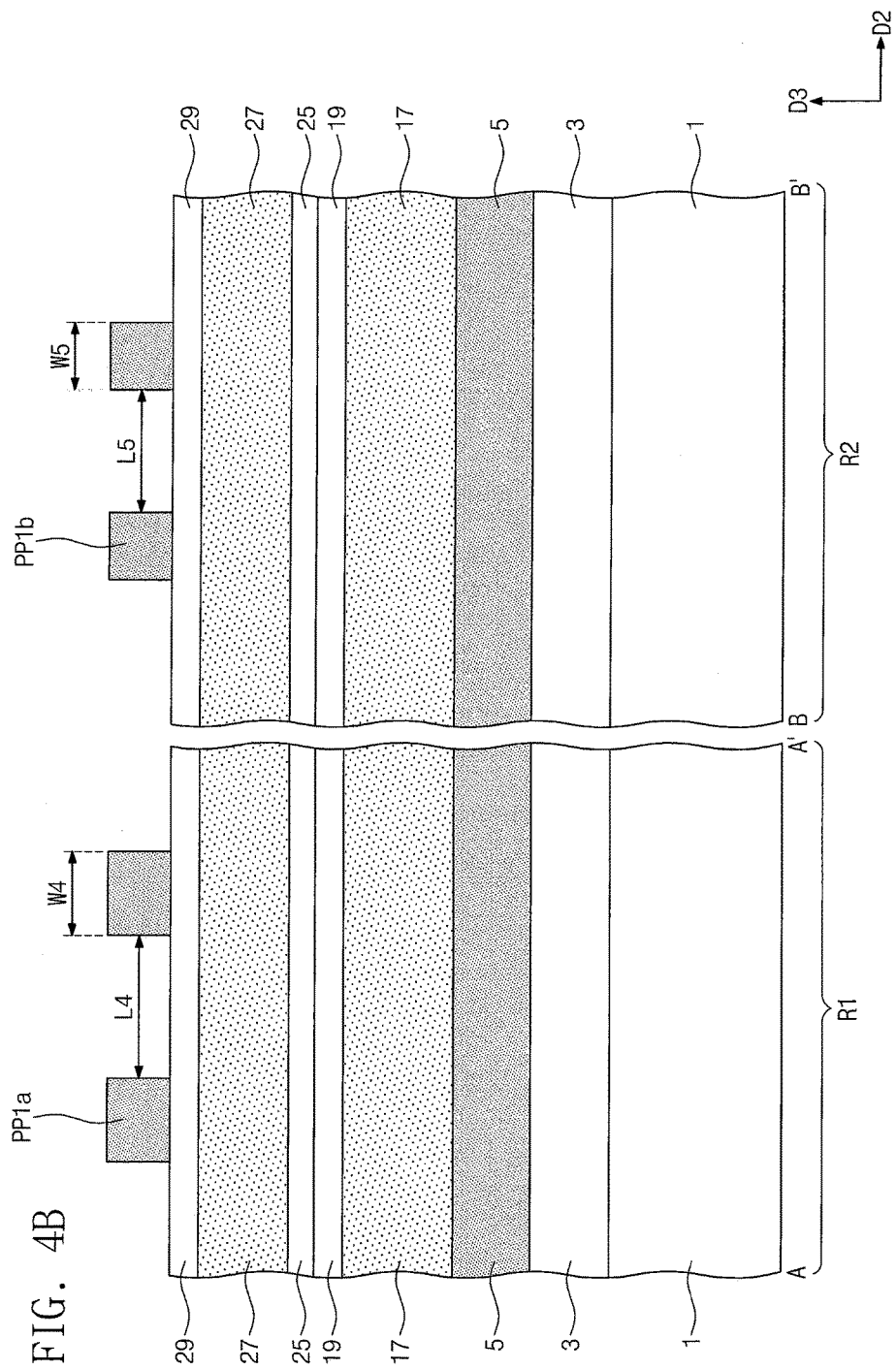

Referring to FIGS. 4A and 4B, a lower mold layer 3, a lower mask layer 5, an intermediate mold layer 17, an intermediate mask layer 19, an upper pad layer 25, an upper mold layer 27, and an upper mask layer 29 may be sequentially formed on the substrate 1. The substrate 1 may include first and second regions R1 and R2. In some embodiments, the first region R1 may be a memory cell region, on which a plurality of memory cell transistors for storing data may be provided. In some embodiments, the first region R1 may be a logic cell region, on which logic transistors constituting a logic circuit may be formed. In some embodiments, the second region R2 may be a part of the overlay key region previously described with reference to FIG. 2A. In some embodiments, the second region R2 may be a part of the boundary region BR previously described with reference to FIG. 2B.

The substrate 1 may be a single-crystalline silicon wafer or a silicon-on-insulator (SOI) substrate. The lower mold layer 3 may include, for example, at least one of a silicon oxide layer, a silicon oxynitride layer, or a silicon nitride layer. In some embodiments, the lower mold layer 3 may be a pad oxide that is formed of or include a silicon oxide layer. The lower mask layer 5 may be formed of or include a poly-silicon layer. The intermediate mold layer 17 and the upper mold layer 27 may independently include, for example, at least one of an amorphous carbon layer (ACL), a spin-on-hardmask (SOH) layer, or a spin-on-carbon (SOC) layer. The upper pad layer 25 may be formed of or include, for example, a silicon oxide layer. In some embodiments, the intermediate mask layer 19 and the upper mask layer 29 may be formed of substantially the same material (e.g., a silicon oxynitride layer or a silicon nitride layer).

Photoresist patterns PP1a and PP1b may be formed on the upper mask layer 29. The photoresist patterns PP1a and PP1b may include first photoresist patterns PP1a on the first region R1 and second photoresist patterns PP1b on the second region R2. The first and second photoresist patterns PP1a and PP1b may be line-shaped patterns extending in a first direction D1 that is parallel to the top surface of the substrate 1.

The first photoresist patterns PP1a may define outlines of active patterns AP to be described below, and the second photoresist patterns PP1b may define outlines of dummy patterns DP to be described below. Here, the second photoresist pattern PP1b may define a width of at least one of third merged patterns MP3, which are parts of the dummy patterns DP and will be described below.

Each of the first photoresist patterns PP1a may have a fourth width W4, and each of the second photoresist patterns PP1b may have a fifth width W5. The fourth width W4 and the fifth width W5 may be different from each other; for example, the fourth width W4 may be greater than the fifth width W5.

A distance between adjacent ones of the first photoresist patterns PP1a may be a fourth distance L4, and a distance between adjacent ones of the second photoresist patterns PP1b may be a fifth distance L5. The fourth distance L4 and the fifth distance L5 may be different from each other; for example, the fourth distance L4 may be longer than the fifth distance L5.

Referring to FIGS. 5A and 5B, the upper mask layer 29 may be etched using the first and second photoresist patterns PP1a and PP1b as an etch mask to form first and second upper mask patterns 29a and 29b on the first and second regions R1 and R2, respectively. When viewed in a plan view, the first and second upper mask patterns 29a and 29b may have shapes corresponding to the first and second photoresist patterns PP1a and PP1b, respectively.

The upper mold layer 27 and the upper pad layer 25 may be etched using the first and second upper mask patterns 29a and 29b as an etch mask to sequentially form first upper mold patterns 27a and first upper pad patterns 25a on the first region R1. And, second upper mold patterns 27b and second upper pad patterns 25b may be sequentially formed on the second region R2. When viewed in a plan view, the first and second upper mold patterns 27a and 27b may have shapes corresponding to the first and second upper mask patterns 29a and 29b, respectively. The first and second upper pad patterns 25a and 25b may have shapes corresponding to the first and second upper mask patterns 29a and 29b, respectively. A portion of a top surface of the intermediate mask layer 19 may be exposed through a space between the first and second upper pad patterns 25a and 25b.

All of the first and second photoresist patterns PP1a and PP1b may be removed during the process of forming the first and second upper mask patterns 29a and 29b, the first and second upper mold patterns 27a and 27b, and the first and second upper pad patterns 25a and 25b. Accordingly, top surfaces of the first and second upper mask patterns 29a and 29b may be exposed. In some embodiments, the first and second photoresist patterns PP1a and PP1b may be removed before forming the first and second upper mold patterns 27a and 27b and the first and second upper pad patterns 25a and 25b. The first and second upper mask patterns 29a and 29b may also be partially etched during the process of forming the first and second upper mold patterns 27a and 27b and the first and second upper pad patterns 25a and 25b.

Referring to FIGS. 6A and 6B, a first spacer layer 41 may be conformally formed on the substrate 1. In some embodiments, the first spacer layer 41 may be formed of or include a material having an etch selectivity with respect to all of the intermediate mask layer 19, the upper mold layer 27, and the upper mask layer 29. The first spacer layer 41 may be formed of or include the same material as the upper pad layer 25. As an example, the first spacer layer 41 may be formed of a silicon oxide layer that is formed by an atomic layer deposition (ALD) method. The first spacer layer 41 may have a first thickness T1. The first thickness T1 may be substantially equal to a maximum width W6 of a first spacer 41s to be described below.

Referring to FIGS. 7A and 7B, the first spacer layer 41 may be anisotropically etched to form a pair of first spacers 41s covering both sidewalls of each of the first and second upper mold patterns 27a and 27b. The anisotropic etching process may be performed until top surfaces of the first and second upper mask patterns 29a and 29b and the intermediate mask layer 19 are exposed. All of the first spacers 41s on the first and second regions R1 and R2 may have the same width (e.g., the maximum width W6). In particular, the first spacers 41s may be used to define a distance L1 between the active patterns AP and distances L2 and L3 between the dummy patterns DP, as will be described below.

Referring to FIGS. 8A and 8B, the first and second upper mask patterns 29a and 29b may be selectively removed. Since the intermediate mask layer 19 includes the same material as the first and second upper mask patterns 29a and 29b, the intermediate mask layer 19 may be partially removed when the first and second upper mask patterns 29a and 29b are removed. Accordingly, first recess regions RS1 may be formed in an upper portion of the intermediate mask layer 19.

Next, the exposed portions of the first and second upper mold patterns 27a and 27b may be selectively removed. As an example, the first and second upper mold patterns 27a and 27b may be removed by an ashing process using oxygen.

Figure 9A:
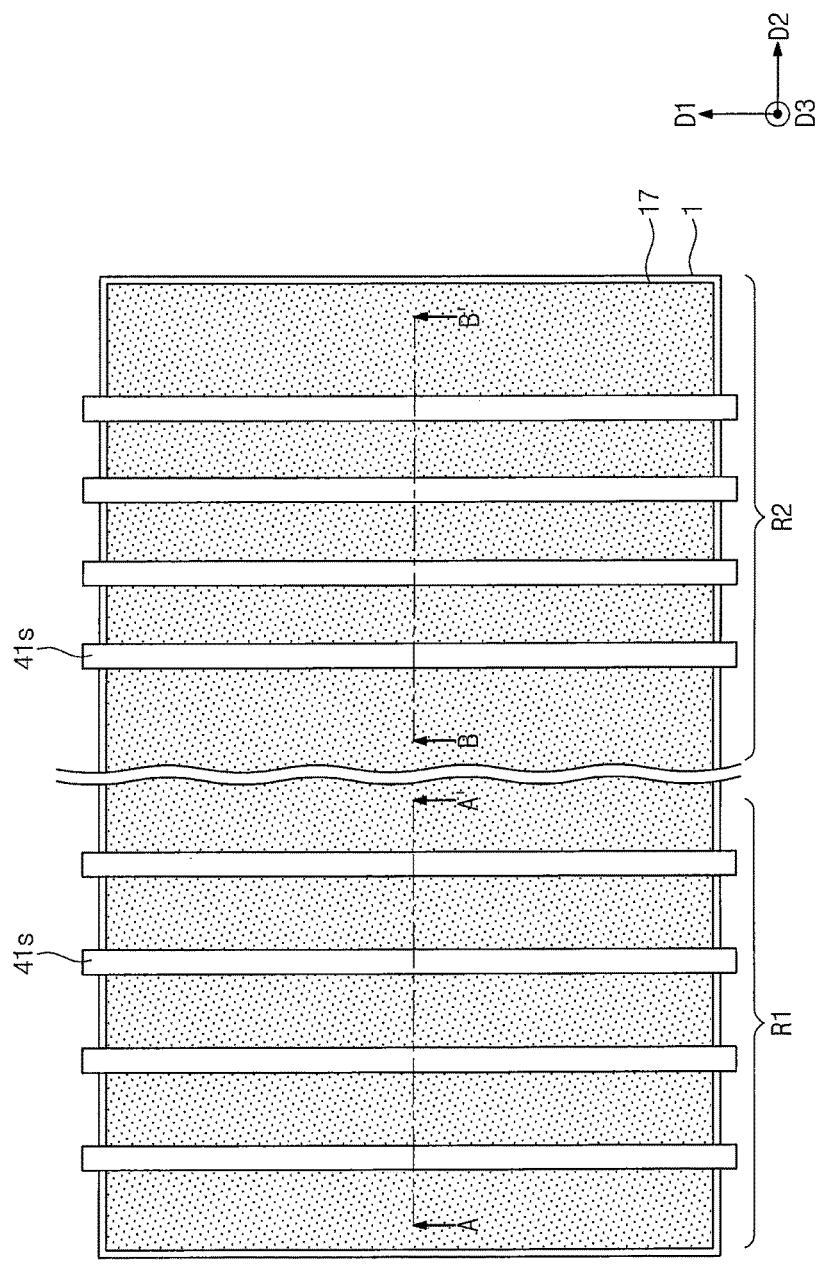
Figure 9B:
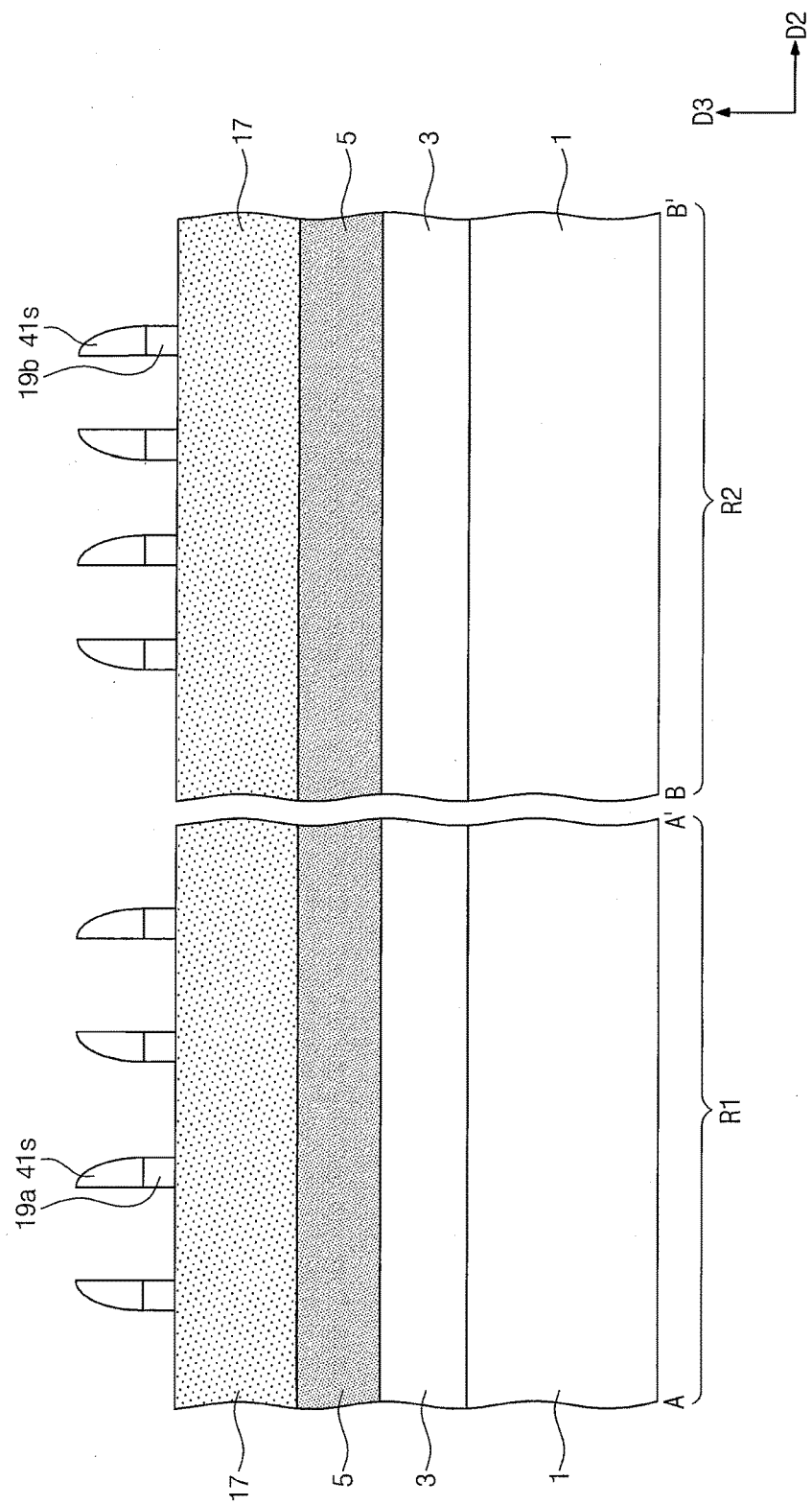

Referring to FIGS. 9A and 9B, the first spacers 41s and the first and second upper pad patterns 25a and 25b may be anisotropically etched to completely remove the first and second upper pad patterns 25a and 25b. Accordingly, heights of the first spacers 41s may be decreased.

Next, the intermediate mask layer 19 may be etched using the first spacers 41s as an etch mask to form first and second intermediate mask patterns 19a and 19b on the first and second regions R1 and R2, respectively. When viewed in a plan view, the first and second intermediate mask patterns 19a and 19b may have shapes corresponding to the first spacers 41s, respectively.

Figure 10B:
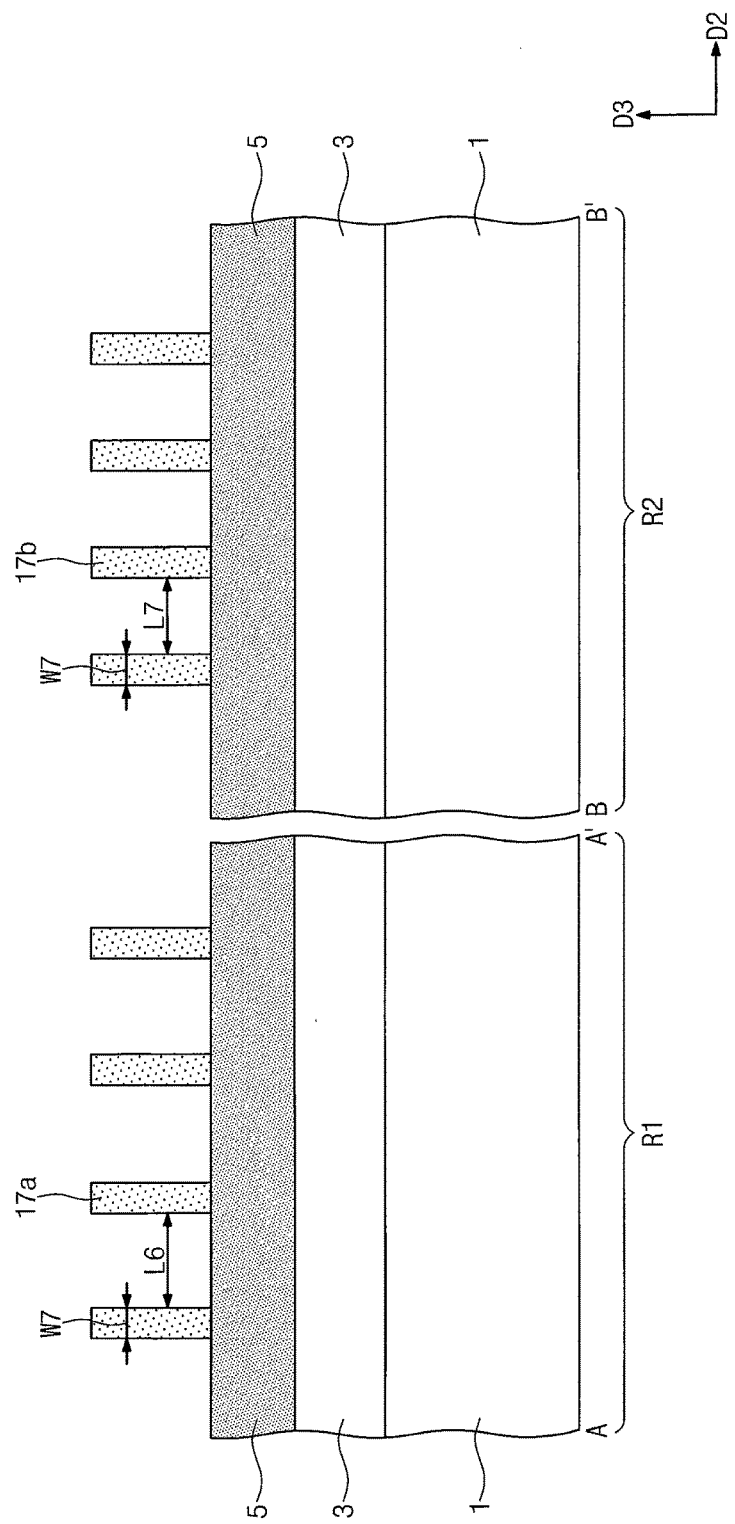

Referring to FIGS. 10A and 10B, the intermediate mold layer 17 may be etched using the first and second intermediate mask patterns 19a and 19b as an etch mask to form first and second intermediate mold patterns 17a and 17b on the first and second regions R1 and R2, respectively. The first spacers 41s may be removed before or during the formation of the first and second intermediate mold patterns 17a and 17b. When viewed in a plan view, the first and second intermediate mold patterns 17a and 17b may have shapes corresponding to the first and second intermediate mask patterns 19a and 19b, respectively. A portion of a top surface of the lower mask layer 5 may be exposed through a space between the first and second intermediate mold patterns 17a and 17b. The first and second intermediate mask patterns 19a and 19b may be selectively removed to expose top surfaces of the first and second intermediate mold patterns 17a and 17b.

Each of the first and second intermediate mold patterns 17a and 17b may have a seventh width W7. The seventh width W7 may be substantially equal to the maximum width W4 of the first spacer 41s. A distance between an adjacent pair of the first intermediate mold patterns 17a may be a sixth distance L6, and a distance between an adjacent pair of the second intermediate mold patterns 17b may be a seventh distance L7. The sixth distance L6 may be substantially equal to the fourth width W4 of the first photoresist pattern PP1a, and the seventh distance L7 may be substantially equal to the fifth width W5 of the second photoresist pattern PP1b. In other words, the sixth distance L6 may be longer than the seventh distance L7.

Figure 11B:
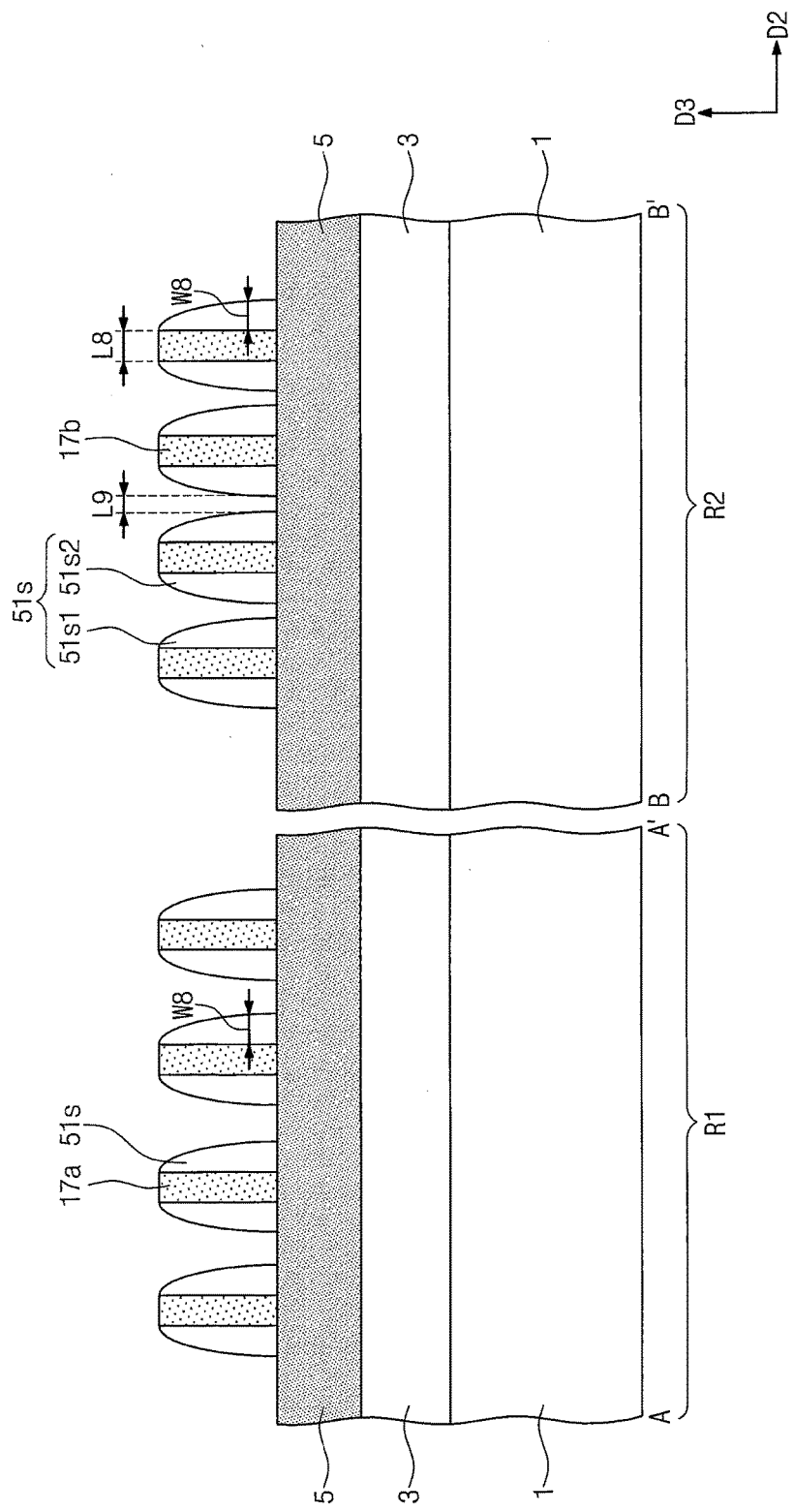

Referring to FIGS. 11A and 11B, a pair of second spacers 51s may be respectively formed on both sidewalls of each of the first and second intermediate mold patterns 17a and 17b. The formation of the second spacers 51s may include forming a second spacer layer and anisotropically etching the second spacer layer to form the second spacers 51s. A method of forming the second spacers 51s may be similar to that for forming the first spacers 41s previously described with reference to FIGS. 6A, 6B, 7A, and 7B. The second spacer layer may have a second thickness. The second thickness may be equal to or different from the first thickness T1 of the first spacer layer 41, but the inventive concept may not be limited thereto. As an example, the second spacers 51s may be formed of a material (e.g., silicon oxide) that has an etch selectivity with respect to all of the intermediate mold layer 17 and the lower mask layer 5.

The maximum width of each of the second spacers 51s may be an eighth width W8. The eighth width W8 may be substantially equal to the second thickness. The eighth width W8 may be substantially equal to a width W1 of an active pattern AP and a width W3 of a third normal pattern NP3 to be described below.

A distance between a pair of the second spacers 51s, which are respectively formed at both sides of the second intermediate mold pattern 17b, may be an eighth distance L8. In other words, the eighth distance L8 may be substantially equal to the seventh width W7 of the second intermediate mold pattern 17b.

On the second region R2, the second spacers 51s may include a first sub-spacer 51s1 and a second sub-spacer 51s2 facing each other. The first and second sub-spacers 51s1 and 51s2 may be positioned between adjacent ones of the second intermediate mold patterns 17b as illustrated in FIG. 11B. Here, a distance between the first and second sub-spacers 51s1 and 51s2 may be a ninth distance L9. The ninth distance L9 may be shorter than the eighth distance L8. Furthermore, the ninth distance L9 may be shorter than the eighth width W8. As an example, the ninth distance L9 may range from about 1 nm to about 15 nm.

Referring to FIGS. 12A and 12B, the first and second intermediate mold patterns 17a and 17b may be selectively removed. As an example, the first and second intermediate mold patterns 17a and 17b may be removed by an ashing process using oxygen.

Figure 13B:
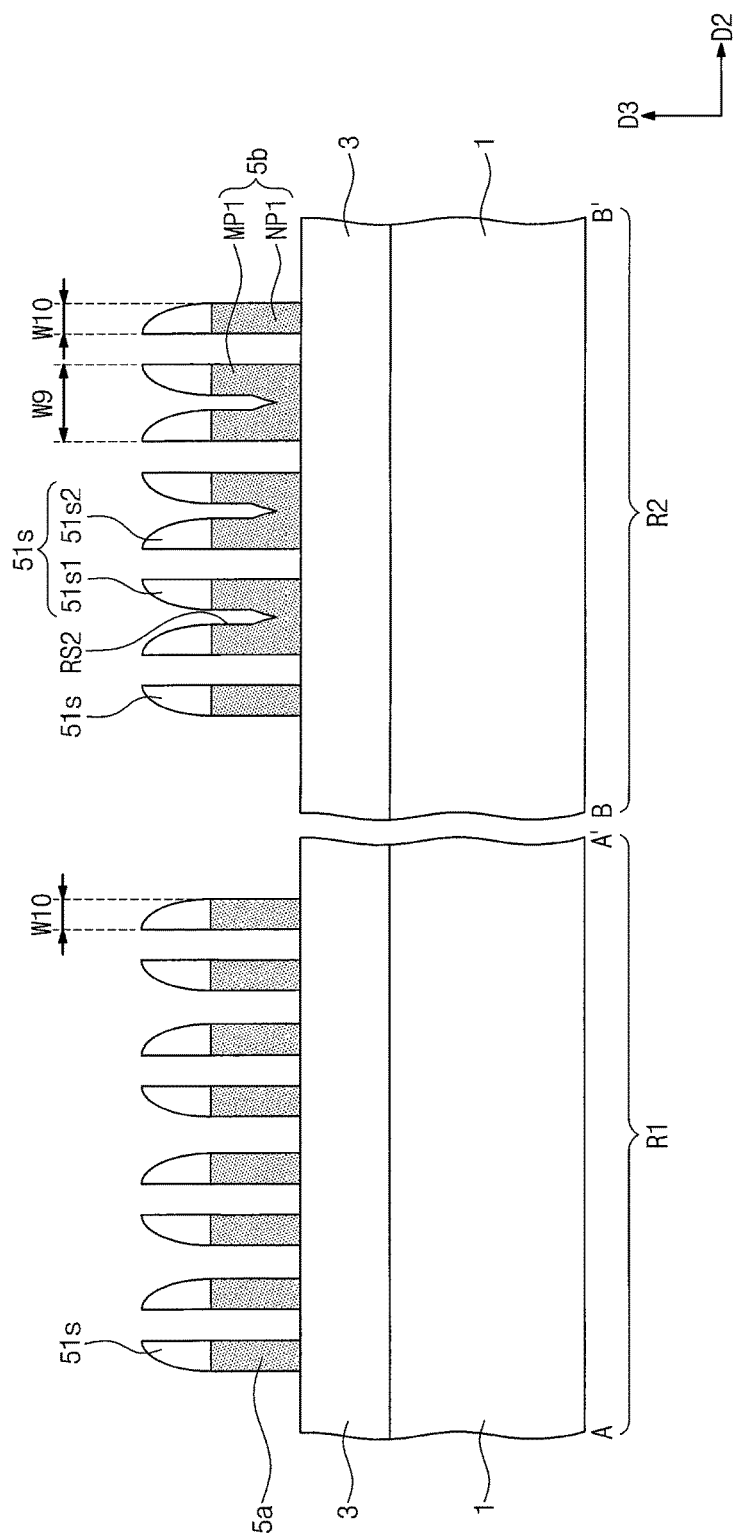

Referring to FIGS. 13A and 13B, the lower mask layer 5 may be etched using the second spacers 51s as an etch mask to form first and second lower mask patterns 5a and 5b on the first and second regions R1 and R2, respectively.

The second lower mask patterns 5b may include first normal patterns NP1 and first merged patterns MP1. The first merged pattern MP1 may be formed below the first sub-spacer 51s1 and the second sub-spacer 51s2. For example, the lower mask layer 5 between the first and second sub-spacers 51s1 and 51s2 may not be effectively etched during an etching process for forming the first and second lower mask patterns 5a and 5b. This is because the distance L9 between the first and second sub-spacers 51s1 and 51s2 is too small to allow an etchant material to pass through a space between the first and second sub-spacers 51s1 and 51s2. Accordingly, the lower mask layer 5 between the first and second sub-spacers 51s1 and 51s2 may not be effectively etched, and thus, the first merged patterns MP1 may have second recess regions RS2. In other words, the second recess regions RS2 may be formed in upper portions of the first merged patterns MP1, respectively. As a result, each of the first merged patterns MP1 may have a ninth width W9, which may be larger than two times the eighth width W8 of FIG. 11B (i.e., W9>2×W8). As an example, the ninth width W9 may be about 2-2.5 times the eighth width W8 of the second spacer 51s, but the inventive concept may not be limited thereto. Meanwhile, the first normal patterns NP1 may be formed below the second spacers 51s at an outermost region of the second region R2.

When viewed in a plan view, the first lower mask patterns 5a may have shapes corresponding to those of the second spacers 51s on the first region R1, and the first normal patterns NP1 may have shapes corresponding to those of the second spacers 51s. In some embodiments, the first lower mask patterns 5a and the first normal patterns NP1 may have substantially the same width (e.g., a tenth width W10). The tenth width W10 may be substantially equal to the eighth width W8 of the second spacer 51s.

Figure 14B:
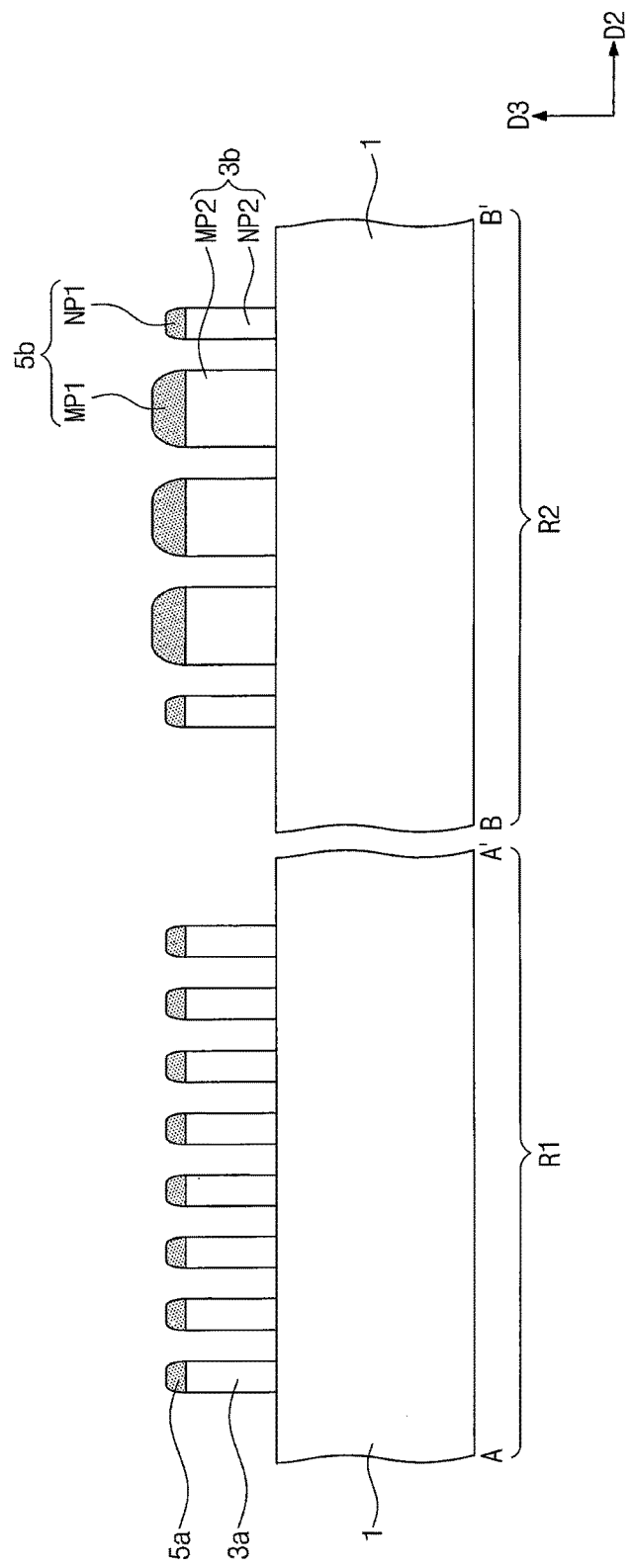

Referring to FIGS. 14A and 14B, the lower mold layer 3 may be etched using the first and second lower mask patterns 5a and 5b as an etch mask to form first and second lower mold patterns 3a and 3b on the first and second regions R1 and R2, respectively. When viewed in a plan view, the first and second lower mold patterns 3a and 3b may have shapes corresponding to the first and second lower mask patterns 5a and 5b, respectively. A portion of the top surface of the substrate 1 may be exposed through a space between the first and second lower mold patterns 3a and 3b.

The second lower mold patterns 3b may include second normal patterns NP2 and second merged patterns MP2. The first normal patterns NP1 may be used as a mask for forming the second normal patterns NP2, and the first merged patterns MP1 may be used as a mask for forming the second merged patterns MP2. Accordingly, the second merged pattern MP2 may have substantially the same width as the width W9 of the first merged pattern MP1, which is used as the mask therefore.

Referring to FIGS. 15A and 15B, remaining portions of the first and second lower mask patterns 5a and 5b may be removed. An upper portion of the substrate 1 may be etched using the first and second lower mold patterns 3a and 3b as an etch mask, and thus, the active patterns AP and the dummy patterns DP may be formed on the first and second regions R1 and R2, respectively. When viewed in a plan view, the active patterns AP may have shapes corresponding to those of the first lower mold patterns 3a, and the dummy patterns DP may have shapes corresponding to those of the second lower mold patterns 3b.

In detail, the dummy patterns DP may include the third normal patterns NP3 and the third merged patterns MP3. The third normal patterns NP3 may be formed using the second normal patterns NP2 as an etch mask, and the third merged patterns MP3 may be formed using the second merged patterns MP2 as an etch mask.

The active patterns AP and the dummy patterns DP may be line-shaped patterns extending in the first direction D1. The active patterns AP and the dummy patterns DP may be spaced apart from each other in the second direction D2. In some embodiments, the active patterns AP, the normal patterns NP3, and the third merged patterns MP3 may be formed to have the widths and distances that have been described with reference to FIGS. 3A and 3B.

According to some embodiments of the inventive concept, on the first region R1, it is possible to form eight active patterns AP from a pair of the first upper mold patterns 27a. In other words, if n is the number of the first upper mold patterns 27a and a spacer-forming process is performed twice, the number of the active patterns AP formed on the first region R1 is 4n.

By contrast, on the second region R2, it is possible to form five dummy patterns DP from a pair of the second upper mold patterns 27b. In detail, three third merged patterns MP3 may be formed from a pair of the second upper mold patterns 27b. In other words, if the spacer-forming process is performed twice and a pair of the sub-spacers 51s1 and 51s2 are merged, it is possible to form 2m+1 dummy patterns DP from m second upper mold patterns 27b. Here, the number of the third merged patterns MP3 on the second region R2 may be 2m−1.

Referring back to FIGS. 3A and 3B, device isolation patterns ST may be formed to fill the trenches TR, respectively, which are formed between the active patterns AP and the dummy patterns DP. The formation of the device isolation patterns ST may include forming an oxide layer on the substrate 1 to cover the active patterns AP and the dummy patterns DP and then performing an etch-back process on the oxide layer. Accordingly, the active patterns AP and the dummy patterns DP may have protruding portions whose top surfaces are higher than those of the device isolation patterns ST.

Gate electrodes GE may be formed on the substrate 1 to cross the active patterns AP and extend in the second direction D2. The gate electrodes GE may be arranged in the first direction D1. In some embodiments, the gate electrodes GE may be locally formed on only the first region R1.

A gate insulating pattern GI may be formed between each of the gate electrodes GE and the active patterns AP. A capping pattern GP may be formed on each of the gate electrodes GE. The gate insulating pattern GI, the gate electrode GE, and the capping pattern GP may be formed by a patterning process, which is performed after forming a gate insulating layer, a gate layer, and a capping layer on the substrate 1. The gate insulating layer may be formed of or include, for example, at least one of a silicon oxide layer, a silicon oxynitride layer, or a high-k dielectric layer, whose dielectric constant is higher than that of silicon oxide. The gate layer may be formed of or include, for example, at least one of doped semiconductors, metals, or conductive metal nitrides. The capping layer may be formed of or include, for example, at least one of a silicon oxide layer, a silicon nitride layer, or a silicon oxynitride layer.

In addition, although not shown, gate spacers may be formed at both sides of each of the gate electrodes GE. The formation of the gate spacers may include forming a spacer layer to cover the gate electrodes GE and anisotropically etching the spacer layer. The spacer layer may be formed of or include, for example, at least one of a silicon oxide layer, a silicon nitride layer, or a silicon oxynitride layer.

Thereafter, although not shown, an ion implantation process may be performed on the structure provided with the gate electrodes GE to form source/drain regions. The source/drain regions may be formed in the active patterns AP at both sides of the gate electrode GE. Next, an interlayered insulating layer IL may be formed on the substrate 1 to cover the active patterns AP, the gate electrodes GE, and the dummy patterns DP. Source/drain contacts (not shown) may be formed to penetrate the interlayered insulating layer IL and may be connected to the source/drain regions, respectively. Gate contacts (not shown) may be formed to penetrate the interlayered insulating layer IL and may be connected to the gate electrodes GE, respectively.

In the process of forming the gate electrodes GE, the source/drain contacts, and the gate contacts, the third merged patterns MP3 may be used as key patterns for aligning the gate electrodes GE, the source/drain contacts, and the gate contacts to their proper positions. Here, since the third merged patterns MP3 has a relatively large width (e.g., W2), it may be possible to prevent the key patterns from leaning and consequently to prevent the key patterns from being misread in the aligning steps.

According to some embodiments of the inventive concept, even when, in order to fabricate a semiconductor device, the same process is performed on the first and second regions R1 and R2, by adjusting widths and distances of the first and second photoresist patterns PP1a and PP1b, it is possible to form the third merged patterns MP3 having a width greater than those of the active patterns AP and the normal patterns NP3. In other words, without performing an additional process on one of the first and second regions R1 and R2, it is possible to form the third merged patterns MP3 with a relatively large width. This may make it possible to reduce a fabrication cost. The third merged patterns MP3 may also be used as the overlay key and/or the boundary pattern, as previously described with reference to FIGS. 3A and 3B, and this may make it possible to increase reliability and stability in the process of fabricating a semiconductor device.

FIGS. 16A to 18A are plan views illustrating a method of fabricating a semiconductor device, according to some embodiments of the inventive concept. FIGS. 16B to 18B are cross-sectional views taken along the lines A-A' and B-B' of FIGS. 16A to 18A, respectively. In the following description, an element previously described with reference to FIGS. 4A to 15A and FIGS. 4B to 15B may be identified by a similar or identical reference number without repeating an overlapping description thereof, for the sake of brevity.

Figure 16B:
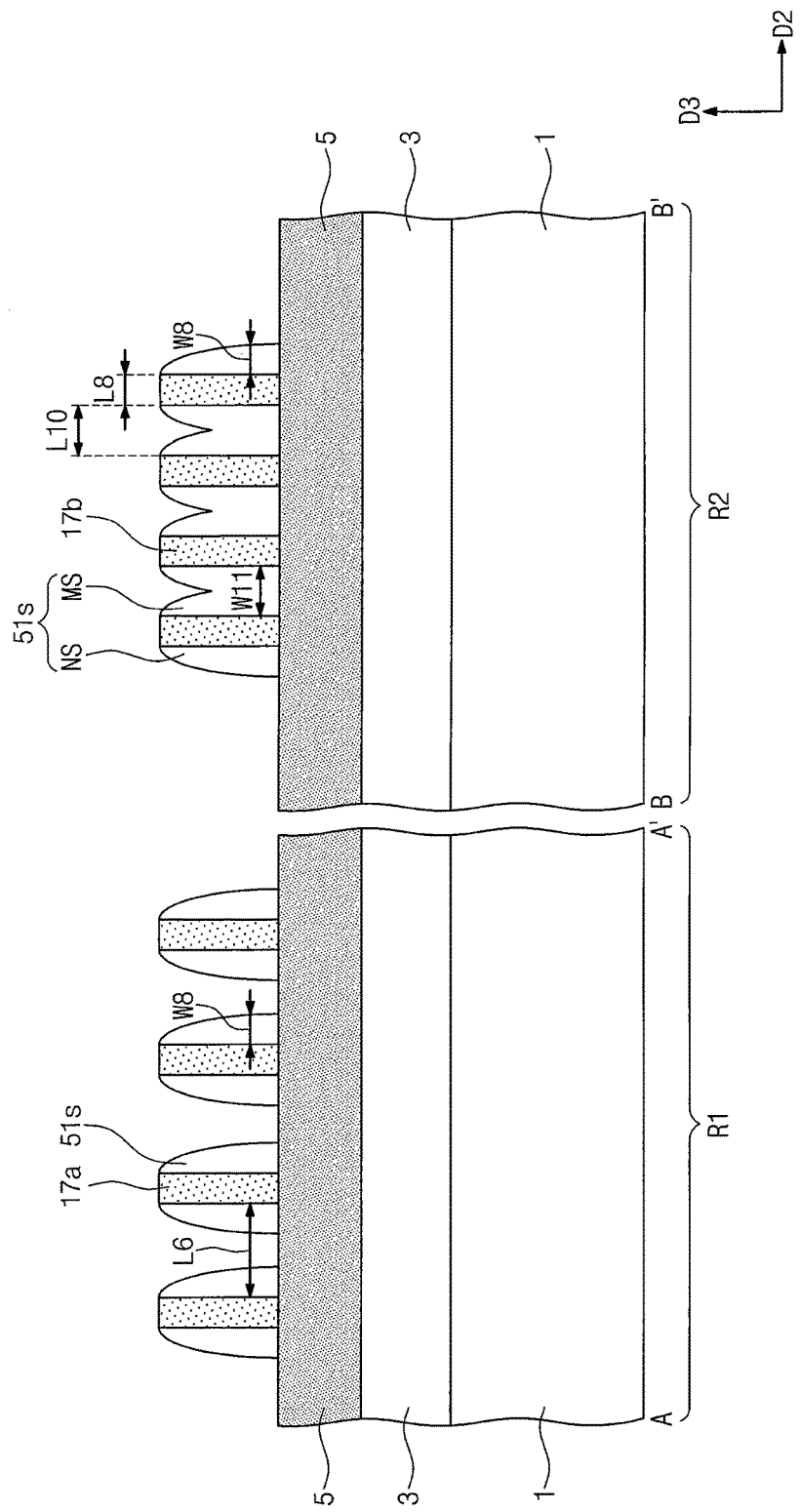

Referring to FIGS. 16A and 16B, the first and second intermediate mold patterns 17a and 17b may be formed on the lower mask layer 5. A process of forming the first and second intermediate mold patterns 17a and 17b may be similar to that described with reference to FIGS. 3A to 10A and 3B to 10B. A distance between an adjacent pair of the second intermediate mold patterns 17b may be a tenth distance L10. The tenth distance L10 may be shorter than the seventh distance L7 previously described with reference to FIGS. 10A and 10B. As an example, the tenth distance L10 may be about 1.3-2 times a maximum width W8 of the second spacer 51s.

Next, the second spacers 51s may be formed on sidewalls of the first and second intermediate mold patterns 17a and 17b. For example, a pair of the second spacers 51s may be formed on both sidewalls of each of the first intermediate mold patterns 17a on the first region R1.

The second spacers 51s on the second region R2 may include normal spacers NS and merged spacers MS. Since the tenth distance L10 is less than or equal to two times the maximum width W8 of the second spacer 51s, the second spacer 51s may be formed to fill a gap region between a pair of the second intermediate mold patterns 17b. In other words, the lower mask layer 5 between the pair of the second intermediate mold patterns 17b is not exposed by the second spacer 51s. Thus, the merged spacer MS may be formed between the second intermediate mold patterns 17b to have an eleventh width W11 which is larger than a width of the normal spacer NS. The eleventh width W11 may be substantially equal to the tenth distance L10.

Figure 17A:
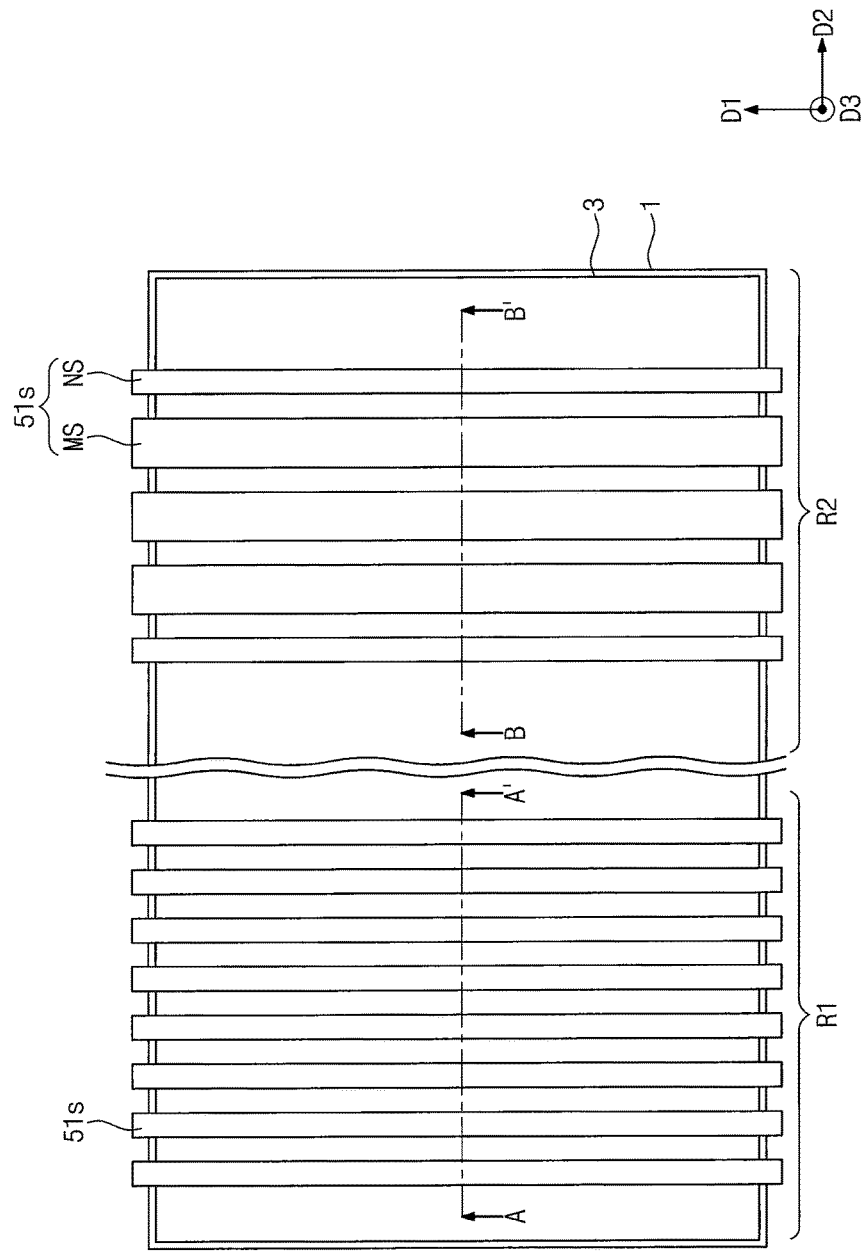
Figure 17B:
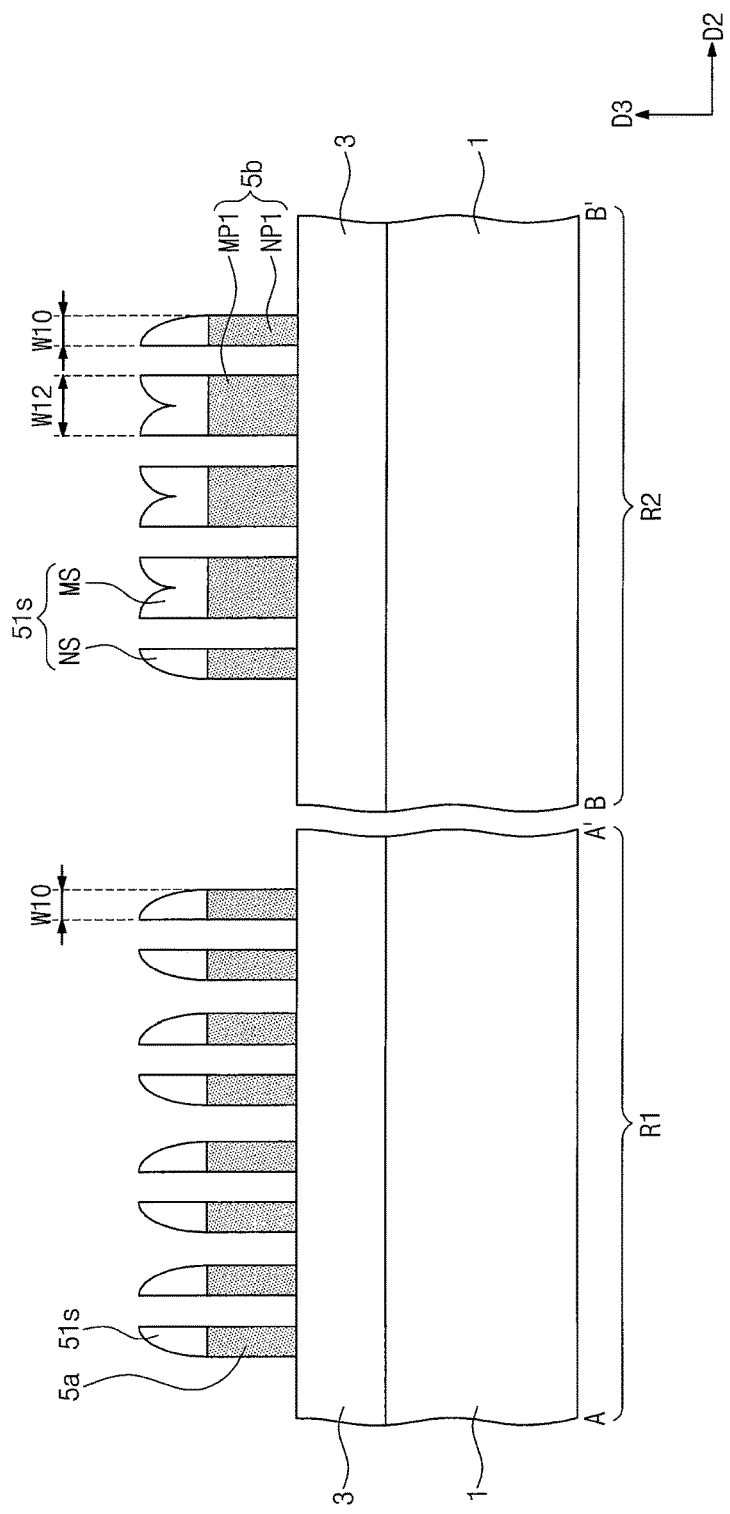

Referring to FIGS. 17A and 17B, the first and second intermediate mold patterns 17a and 17b may be selectively removed. Next, the lower mask layer 5 may be etched using the second spacers 51s as an etch mask to form the first and second lower mask patterns 5a and 5b on the first and second regions R1 and R2, respectively.

The second lower mask patterns 5b may include the first normal patterns NP1 and the first merged patterns MP1. The first merged pattern MP1 may be formed below the merged spacer MS. The first merged pattern MP1 may have a twelfth width W12. Here, the twelfth width W12 may be smaller than the ninth width W9 previously described with reference to FIGS. 13A and 13B. Furthermore, unlike the first merged pattern MP1 of FIGS. 13A and 13B, the second recess region RS2 may not be formed in the upper portion of the first merged pattern MP1 of FIGS. 17A and 17B. Meanwhile, the first normal patterns NP1 may be formed below the normal spacers NS at an outermost region of the second region R2.

Figure 18B:
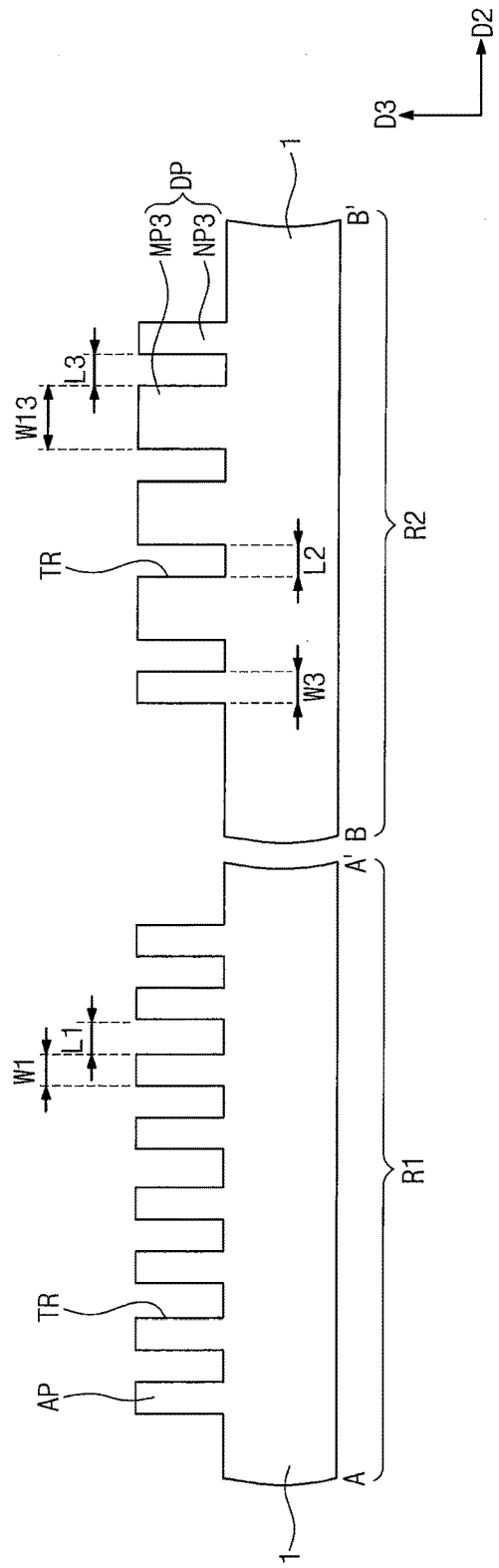

Referring to FIGS. 18A and 18B, the lower mold layer 3 may be etched using the first and second lower mask patterns 5a and 5b as an etch mask to form the first and second lower mold patterns 3a and 3b on the first and second regions R1 and R2, respectively.

An upper portion of the substrate 1 may be etched using the first and second lower mold patterns 3a and 3b as an etch mask, and thus, the active patterns AP and the dummy patterns DP may be formed on the first and second regions R1 and R2, respectively.

In detail, the dummy patterns DP may include the third normal patterns NP3 and the third merged patterns MP3. Each of the third merged patterns MP3 may have a thirteenth width W13. The thirteenth width W13 may be greater than the first width W1 of the active pattern AP. As an example, the thirteenth width W13 may be about 1.3-2 times the maximum width W8 of the second spacer 51s, but the inventive concept may not be limited thereto.

Referring back to FIGS. 3A and 3B, device isolation patterns ST may be formed to fill the trenches TR, respectively, which are formed between the active patterns AP and the dummy patterns DP.

Thereafter, the gate electrodes GE may be formed to cross the active patterns AP, and the interlayered insulating layer IL may be formed on the substrate 1.

Figure 19B:
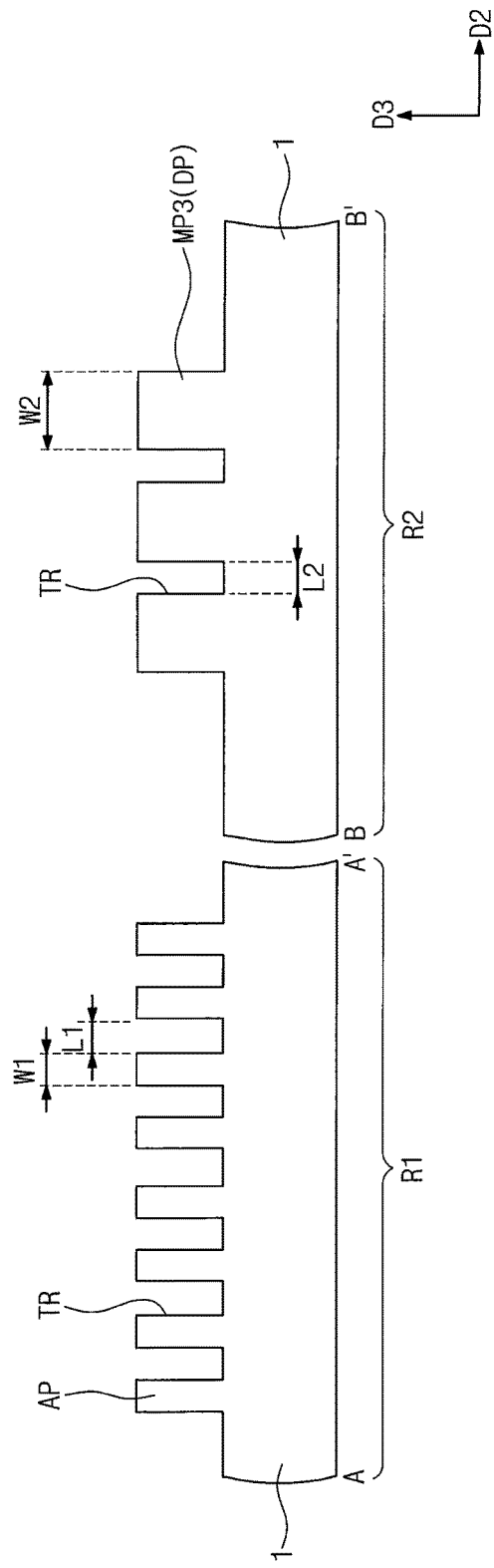
FIG. 19B is a cross-sectional view taken along the lines A-A' and B-B' of FIG. 19A.

FIG. 19A is a plan view illustrating a method of fabricating a semiconductor device, according to some embodiments of the inventive concept. FIG. 19B is a cross-sectional view taken along the lines A-A' and B-B' of FIG. 19A. In the following description, an element previously described with reference to FIGS. 4A to 15A and FIGS. 4B to 15B may be identified by a similar or identical reference number without repeating an overlapping description thereof, for the sake of brevity.

Referring to FIGS. 19A and 19B, a process for selectively removing the third normal patterns NP3 may be performed on the structure of FIGS. 15A and 15B. For example, the removal of the third normal patterns NP3 may include forming a mask pattern to protect the active patterns AP and the third merged patterns MP3 and the third normal patterns NP3 and then removing the third normal patterns NP3. The width W3 of the third normal pattern NP3 may be smaller than the width W2 of the third merged pattern MP3. In the case where the second region R2 is a part of the overlay key region described with reference to FIG. 2A, the third normal pattern NP3 may have a relatively small width. This may lead to leaning or falling down of the third normal pattern NP3, which in turn may lead to a misreading issue in fabrication equipment. Such technical issues may be overcome by removing the third normal patterns NP3.

According to some embodiments of the inventive concept, in a method of fabricating a semiconductor device, patterns with different widths may be formed on different regions, respectively, of a substrate. Here, even when an additional process is not performed on one region of different regions, it may be possible to form patterns with different widths simultaneously. This may make it possible to reduce a fabrication cost. As an example, a pattern with a relatively large width may be used as a key pattern, and this may make it possible to reduce a misreading issue of the key pattern. As another example, a pattern with a relatively large width may be used as a boundary pattern of a chip, and this may make it possible to effectively prevent a foreign material (e.g., water, steam, or oxygen) from being infiltrated into the chip.

While example embodiments of the inventive concepts have been particularly shown and described, it will be understood by one of ordinary skill in the art that variations in form and detail may be made therein without departing from the spirit and scope of the attached claims.

What is claimed is:

1. A method of fabricating a semiconductor device, the method comprising:

forming a lower mold layer on a substrate that includes a first region and a second region;

forming a pair of first intermediate mold patterns on the lower mold layer on the first region and a pair of second intermediate mold patterns on the lower mold layer on the second region, a first distance between the pair of first intermediate mold patterns being greater than a second distance between the pair of second intermediate mold patterns;

forming pairs of first spacers on sidewalls of the pair of first intermediate mold patterns and on sidewalls of the pair of second intermediate mold patterns;

etching the lower mold layer using the pairs of first spacers as an etch mask to form first lower mold patterns and second lower mold patterns on the first and second regions, respectively, the second lower mold patterns comprising at least one first merged pattern having a first width that is substantially equal to the second distance; and etching an upper portion of the substrate using the first and second lower mold patterns as an etch mask to form active patterns and dummy patterns on the first and second regions, respectively.

2. The method of claim 1, wherein the dummy patterns comprise at least one second merged pattern that is formed using the first merged pattern as an etch mask.

3. The method of claim 2, wherein the second region is a key region, and
wherein the second merged pattern is a key pattern.

4. The method of claim 2, wherein the second region is a boundary region between a chip region and a scribe lane region of a semiconductor chip, and
wherein the second merged pattern is a boundary pattern.

5. The method of claim 1, wherein the first spacers on the second region comprise a first sub-spacer and a second sub-spacer disposed between the pair of second intermediate mold patterns.

6. The method of claim 5, wherein a third distance between the first and second sub-spacers is smaller than a second width of the second intermediate mold patterns.

7. The method of claim 5, further comprising:

forming a lower mask layer on the lower mold layer before forming the first and second intermediate mold patterns, the lower mask layer being between the lower mold layer and the first and second intermediate mold patterns; and etching the lower mask layer using the pairs of first spacers as an etch mask, before etching the lower mold layer, to form first lower mask patterns on the first region and second lower mask patterns on the second region, wherein the second lower mask patterns comprise at least one second merged pattern having a second width that is substantially equal to the second distance, and wherein an upper portion of the second merged pattern is formed to define a recess between the first and second sub-spacers.

8. The method of claim 1, wherein forming the pair of first intermediate mold patterns and the pair of second intermediate mold patterns comprises:

forming an intermediate mold layer on the lower mold layer;

forming a first upper mold pattern on the intermediate mold layer on the first region and a second upper mold pattern on the intermediate mold layer on the second region, the first upper mold pattern having a second width that is substantially equal to the first distance and the second upper mold pattern having a third width that is substantially equal to the second distance;

forming pairs of second spacers on sidewalls of the first and second upper mold patterns; and etching the intermediate mold layer using the pairs of second spacers as an etch mask.

9. The method of claim 1, wherein the first spacers on the second region comprise a merged spacer which is formed to fill a gap between the pair of second intermediate mold patterns.

10. The method of claim 1, wherein a largest width of each of the first spacers is a second width, and wherein the first width of the at least one first merged pattern is about 1.3-2.5 times the second width.

11. The method of claim 1, wherein the second lower mold patterns further comprise at least one unmerged pattern, and a width of the unmerged pattern is substantially equal to that of each of the first lower mold patterns.

12. A method of fabricating a semiconductor device, the method comprising:

sequentially forming a plurality of mold layers on a substrate that includes first and second regions;

patterning an uppermost layer of the plurality of mold layers to form n first preliminary mold patterns and m second preliminary mold patterns on the first and second regions, respectively, a width of the first preliminary mold patterns being greater than that of the second preliminary mold patterns;

forming 4n first mold patterns on the first region using the first preliminary mold patterns and forming (2m+1) second mold patterns on the second region using the second preliminary mold patterns; and etching an upper portion of the substrate using the first and second mold patterns as an etch mask to form active patterns on the first region and dummy patterns on the second region, wherein n is an integer that is equal to or greater than 1 and represents a number of the first preliminary mold patterns;

wherein m is an integer that is equal to or greater than 1 and represents a number of the second preliminary mold patterns;

wherein the second region is an overlay key region, and wherein the dummy patterns comprise at least one key pattern.

13. The method of claim 12, wherein the first mold patterns and the second mold patterns are formed at substantially the same time by the same process.

14. The method of claim 12, wherein a number of the at least one key pattern is 2m−1.

15. The method of claim 12, wherein a width of the key pattern is about 1.3-2.5 times a width of the active patterns.

16. A method of forming a semiconductor device, the method comprising:

forming a mask layer on a substrate that includes a first region and a second region;

forming a plurality of mold patterns on the mask layer, each of the plurality of mold patterns having a first width, and the plurality of mold patterns comprising first ones of the plurality of mold patterns that are on the first region and are spaced apart from one another by a first distance and second ones of the plurality of mold patterns that are on the second region and are spaced apart from one another by a second distance that is less than the first distance;

conformally forming a spacer layer on the plurality of mold patterns, the spacer layer having a first thickness;

etching the spacer layer until upper surfaces of the plurality of mold patterns and an upper surface of the mask layer are exposed, first portions of the spacer layer remaining on sides of the first ones of the plurality of mold patterns, respectively, and second portions of the spacer layer remaining on sides of the second ones of the plurality of mold patterns, respectively;

removing the plurality of mold patterns; and then forming a plurality of first mask patterns by etching the mask layer using the first portions of the spacer layer as an etch mask and forming a plurality of second mask patterns by etching the mask layer using the second portions of the spacer layer as an etch mask, the plurality of first mask patterns being on the first region and having a second width, the plurality of second mask patterns being on the second region and having a third width, and the second width being less than the third width, wherein the second distance between adjacent ones of the second ones of the plurality of mold patterns is not greater than two times the first thickness of the spacer layer such that the second portions of the spacer layer remaining on the sides of two adjacent ones of the second ones of the plurality of mold patterns contact each other.

17. The method of claim 16, wherein the second width is substantially equal to the first thickness of the spacer layer, and wherein the third width is substantially equal to the second distance between adjacent ones of the second ones of the plurality of mold patterns.

18. The method of claim 16, further comprising etching the substrate using the plurality of first mask patterns as an etch mask to form active patterns in the first region and etching the substrate using the plurality of second mask patterns as an etch mask to form dummy patterns in the second region.

19. The method of claim 16, wherein the second portions of the spacer layer remaining on the sides of two adjacent ones of the second ones of the plurality of mold patterns expose a portion of the mask layer, and wherein the portion of the mask layer has a width in a range of about 1 nanometer (nm) to about 15 nm.

* * * * *